(12) United States Patent
Kim

(10) Patent No.: US 11,037,914 B2
(45) Date of Patent: Jun. 15, 2021

(54) LIGHT EMITTING DISPLAY DEVICE AND METHOD OF FABRICATING THE SAME

(71) Applicant: Samsung Display Co., Ltd., Yongin-si (KR)

(72) Inventor: Duk Sung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/437,678

(22) Filed: Jun. 11, 2019

(65) Prior Publication Data

US 2020/0013766 A1    Jan. 9, 2020

(30) Foreign Application Priority Data

Jul. 5, 2018 (KR) .................. 10-2018-0078393

(51) Int. Cl.
| | |
|---|---|
| *H01L 25/16* | (2006.01) |
| *H01L 33/50* | (2010.01) |
| *H01L 33/08* | (2010.01) |
| *H01L 33/44* | (2010.01) |
| *H01L 33/58* | (2010.01) |

(52) U.S. Cl.
CPC ............ *H01L 25/167* (2013.01); *H01L 33/08* (2013.01); *H01L 33/44* (2013.01); *H01L 33/50* (2013.01); *H01L 33/58* (2013.01)

(58) Field of Classification Search
None
See application file for complete search history.

(56) References Cited

U.S. PATENT DOCUMENTS

| | | | |
|---|---|---|---|
| 8,541,792 B2* | 9/2013 | Thomsen | C03C 17/245 257/88 |
| 9,111,464 B2 | 8/2015 | Bibl et al. | |
| 9,835,915 B2 | 12/2017 | Kim et al. | |
| 2014/0367633 A1* | 12/2014 | Bibl | H01L 25/0753 257/13 |
| 2015/0228869 A1* | 8/2015 | Yoo | H01L 33/504 362/97.3 |

(Continued)

FOREIGN PATENT DOCUMENTS

| | | |
|---|---|---|
| JP | 2018-41114 A | 3/2018 |
| KR | 10-1704334 B1 | 2/2017 |

*Primary Examiner* — Khaja Ahmad
(74) *Attorney, Agent, or Firm* — Lewis Roca Rothgerber Christie LLP

(57) ABSTRACT

A light emitting display device includes: a display element layer having light emitting elements; a first sub-pixel including a first light emitting element from among the plurality of light emitting elements in a first sub-pixel area of the display element layer; a second sub-pixel including a second light emitting element from among the plurality of light emitting elements in a second sub-pixel area of the display element layer; a third sub-pixel including a third light emitting element from among the plurality of light emitting elements in a third sub-pixel area of the display element layer; a partition wall between the first, second, and third sub-pixels and over an insulating layer, covering the first, second, and third light emitting elements; a first color conversion layer over the insulating layer in the first sub-pixel area and surrounded by the partition wall; and a first color filter over the first color conversion layer.

20 Claims, 22 Drawing Sheets

(56) References Cited

U.S. PATENT DOCUMENTS

| | | | |
|---|---|---|---|
| 2016/0148911 A1* | 5/2016 | Do | H01L 33/62 |
| | | | 257/88 |
| 2017/0062680 A1* | 3/2017 | Yoo | H01L 33/32 |
| 2017/0092820 A1* | 3/2017 | Kim | H01L 33/32 |
| 2017/0125740 A1* | 5/2017 | Lee | H01L 51/5218 |
| 2018/0090058 A1* | 3/2018 | Chen | H01L 25/0753 |

\* cited by examiner

FIG. 10

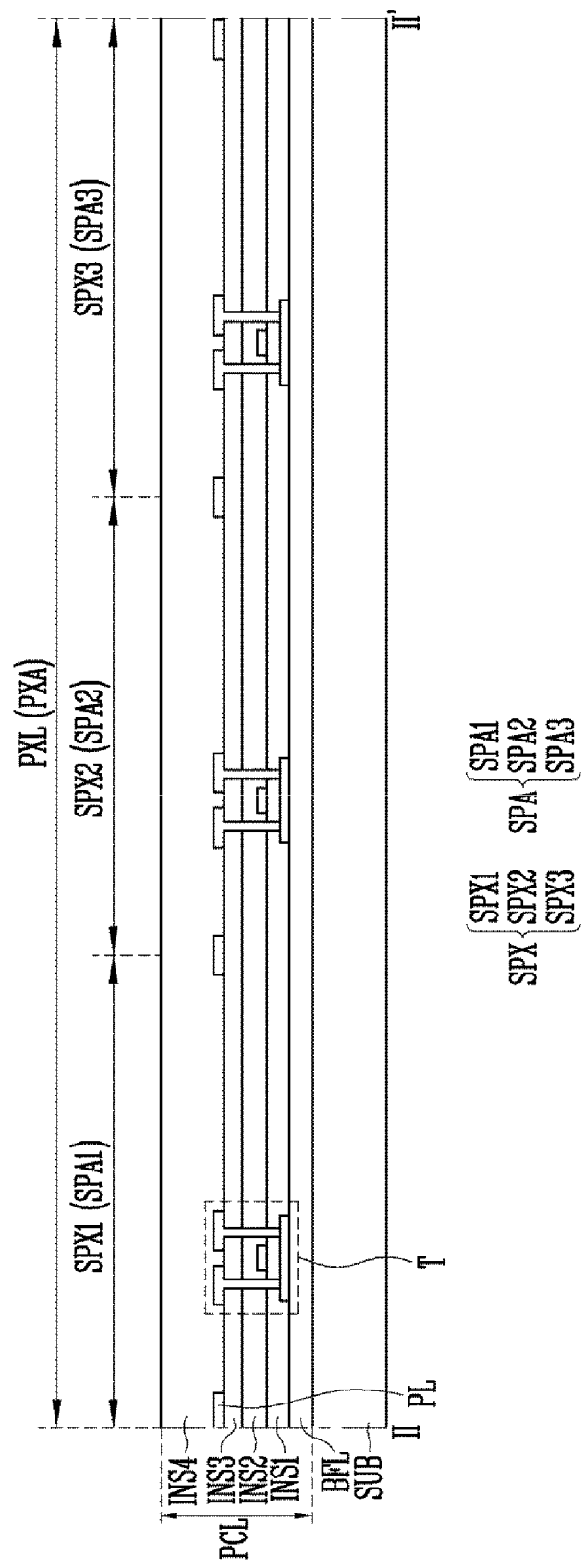

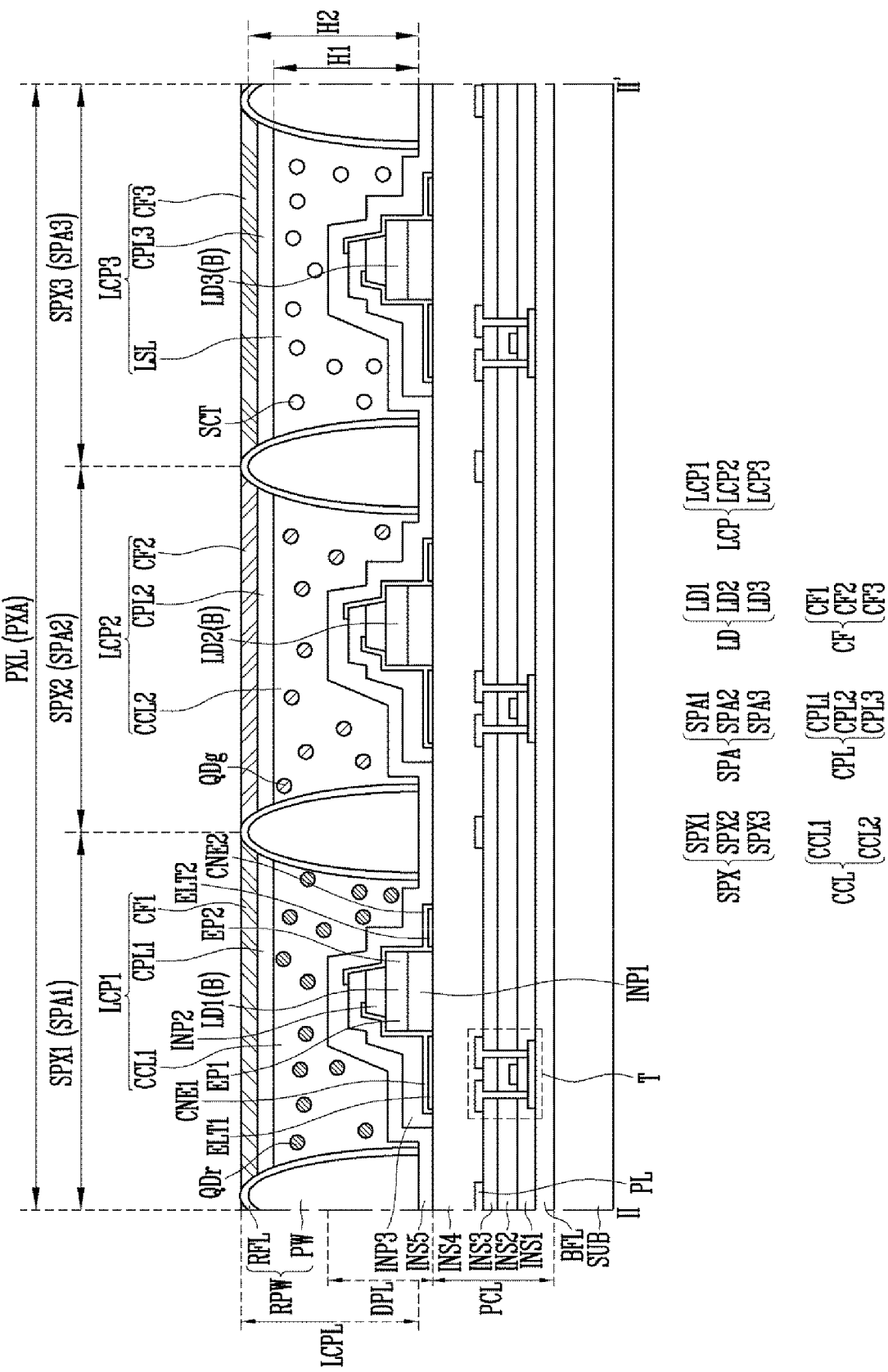

LIGHT EMITTING DISPLAY DEVICE AND METHOD OF FABRICATING THE SAME

CROSS-REFERENCE TO RELATED APPLICATION

This application claims priority to and the benefit of Korean patent application number 10-2018-0078393 filed on Jul. 5, 2018, the entire disclosure of which is incorporated herein in its entirety by reference.

BACKGROUND

1. Field

Various embodiments of the present disclosure relate to a light emitting display device and a method of fabricating the same.

2. Description of Related Art

A display device may include a plurality of pixels for displaying a high-quality images. The pixels each may use light emitting elements such as light emitting diodes as light sources. Each light emitting diode may maintain relatively satisfactory durability even under poor environmental conditions, and have excellent performance in terms of lifetime and luminance.

SUMMARY

Various embodiments of the present disclosure are directed to a light emitting display device capable of enhancing optical efficiency and expressing vivid colors, and a method of fabricating the light emitting display device.

An embodiment of the present disclosure may provide a light emitting display device including: a display element layer having a plurality of light emitting elements; a first sub-pixel including a first light emitting element from among the plurality of light emitting elements in a first sub-pixel area of the display element layer; a second sub-pixel including a second light emitting element from among the plurality of light emitting elements in a second sub-pixel area of the display element layer; a third sub-pixel including a third light emitting element from among the plurality of light emitting elements in a third sub-pixel area of the display element layer; a partition wall between the first, the second, and the third sub-pixels and over an insulating layer covering the first, the second, and the third light emitting elements; a first color conversion layer over the insulating layer in the first sub-pixel area and surrounded by the partition wall; and a first color filter over the first color conversion layer.

In an embodiment, the first, the second, and the third light emitting elements are configured to emit light of substantially the same color.

In an embodiment, the first, the second, and the third light emitting elements are configured to emit blue light.

In an embodiment, the first color conversion layer may include red quantum dots, and the first color filter may include a red color filter.

In an embodiment, the light emitting display device may further include: a second color conversion layer over the insulating layer in the second sub-pixel area and surrounded by the partition wall; and a second color filter over the second color conversion layer.

In an embodiment, the first, the second, and the third light emitting elements may be configured to emit blue light. The first color conversion layer may include red quantum dots and the second color conversion layer may include green quantum dots. The first color filter may include a red color filter and the second color filter may include a green color filter.

In an embodiment, the first, the second, and the third light emitting elements may be configured to emit blue light. Each of the first and the second color conversion layers may include a combination of red quantum dots and green quantum dots. The first color filter may include a red color filter and the second color filter may include a green color filter.

In an embodiment, the light emitting display device may further include: a light scattering layer over the insulating layer in the third sub-pixel area and surrounded by the partition wall; and a third color filter over the light scattering layer.

In an embodiment, the light emitting display device may further include: a first capping layer between the first color conversion layer and the first color filter; a second capping layer between the second color conversion layer and the second color filter; and a third capping layer between the light scattering layer and the third color filter.

In an embodiment, the light emitting display device may further include at least one of a light scattering layer and a third color filter over the insulating layer in the third sub-pixel area.

In an embodiment, the light emitting display device may further include a reflective layer on a surface of the partition wall.

In an embodiment, the reflective layer may cover an entirety of the surface of the partition wall that is exposed upward from the display element layer.

In an embodiment, the partition wall may have a trapezoidal, semi-circular, or semi-elliptical cross-section a width of which is reduced in a direction away from the display element layer.

In an embodiment, a height of the partition wall may be greater than or equal to a height of the first color conversion layer.

In an embodiment, the light emitting display device may further include a substrate having one surface on which the display element layer and the partition are successively arranged.

In an embodiment, the light emitting display device may further include a pixel circuit layer between the substrate and the display element layer.

In an embodiment, each of the first, the second, and the third light emitting elements may include a rod-type light emitting diode having a micro-scale or nano-scale size.

An embodiment of the present disclosure may provide a method of fabricating a light emitting display device, the method may include: preparing a substrate including a first sub-pixel area, a second sub-pixel area, and a third sub-pixel area; forming a display element layer by respectively forming a first light emitting element, a second light emitting element, and a third light emitting element in the first, the second, and the third sub-pixel areas, and by forming an insulating layer configured to cover the first, the second, and the third light emitting elements; forming a partition wall between the first, the second, and the third sub-pixel areas over the insulating layer; respectively forming a first color conversion layer and a second color conversion layer in the first and the second sub pixel areas over the display element layer; and respectively forming a first color filter and a second color filter over the first and the second color conversion layers.

In an embodiment, the forming of the first and the second color version layers may include applying, by an inkjet printing method, fluidic material including quantum dots of at least one color to the first and second sub-pixel areas defined by the partition wall.

In an embodiment, the method may further include forming at least one of a light scattering layer and a third color filter in the third sub-pixel area over the display element layer.

BRIEF DESCRIPTION OF THE DRAWINGS

Figure 10:
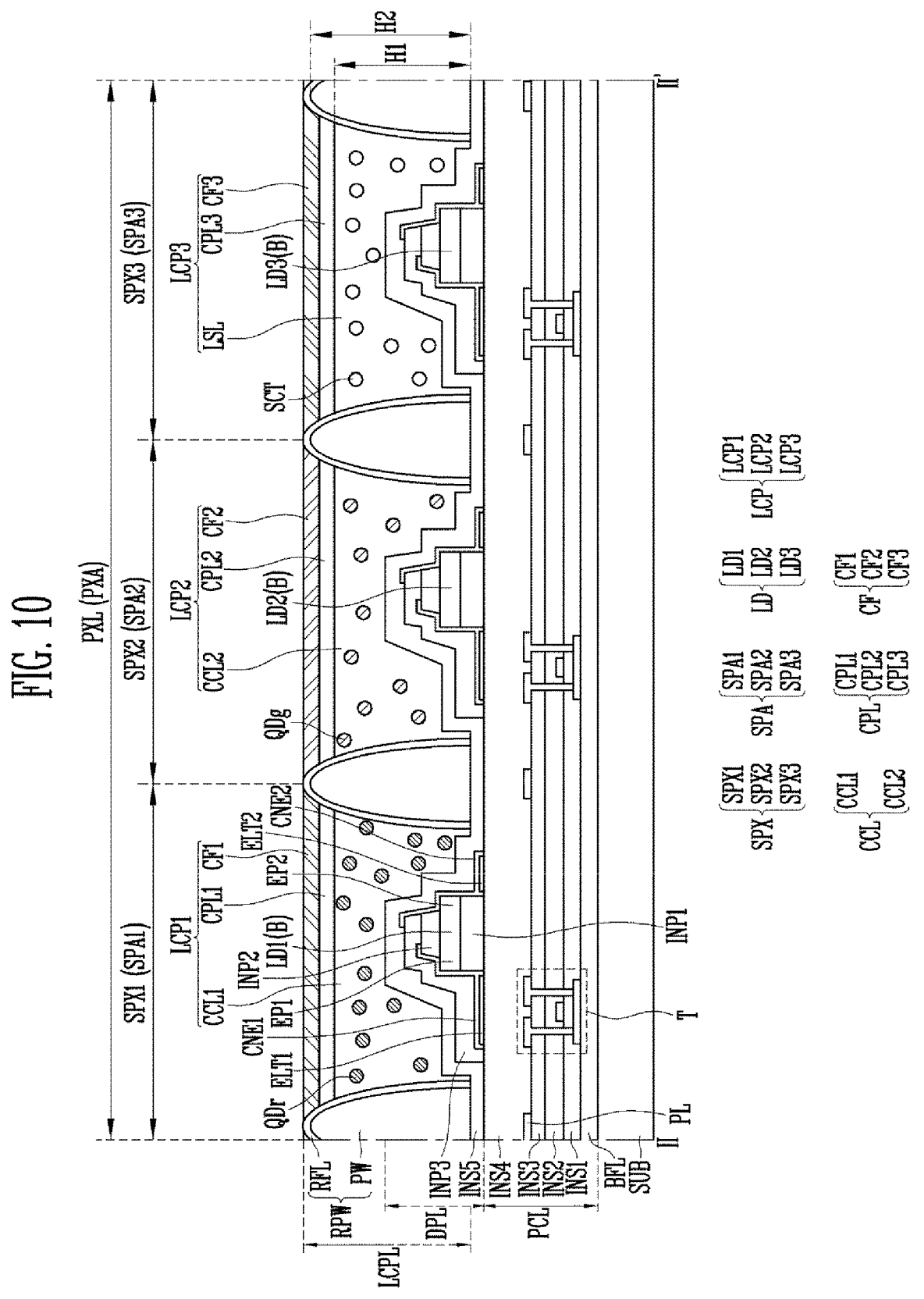

FIGS. 10-16 are sectional views each illustrating the structure of a pixel in accordance with an embodiment of the present disclosure.

FIGS. 17A-17E are sectional views sequentially illustrating a method of fabricating a light emitting display device in accordance with an embodiment of the present disclosure.

DETAILED DESCRIPTION

Figure 1A:
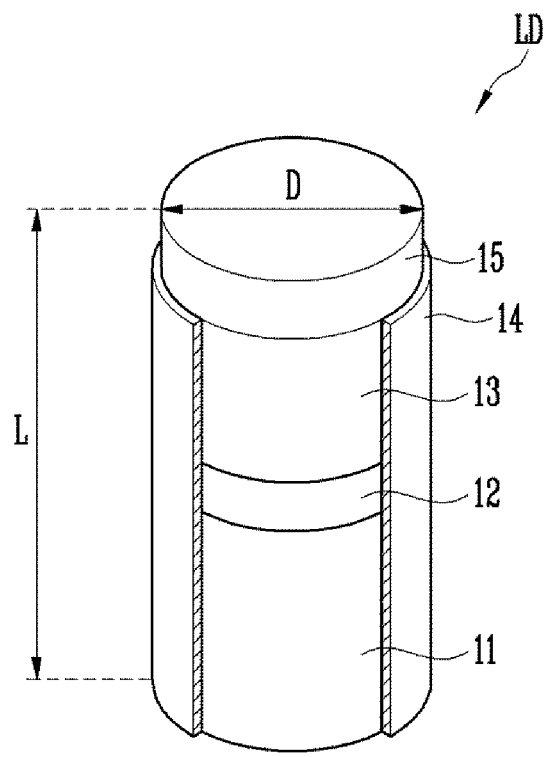
FIGS. 1A and 1B are perspective views respectively illustrating light emitting elements in accordance with embodiments of the present disclosure.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
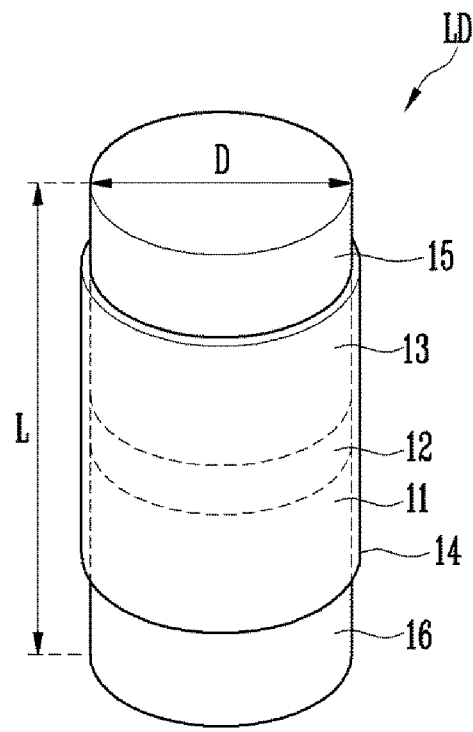

FIGS. 1A and 1B are perspective views respectively illustrating light emitting elements LD in accordance with embodiments of the present disclosure. Although in each of FIGS. 1A and 1B a rod-type light emitting diode having a cylindrical shape is illustrated as an example of the light emitting element LD, the type and/or shape of the light emitting element LD according to the present disclosure is not limited thereto, and any suitable shape may be used.

Referring to FIGS. 1A and 1B, the light emitting element LD, in accordance with an embodiment of the present disclosure, may include a first conductive semiconductor layer 11, a second conductive semiconductor layer 13, and an active layer 12 interposed between the first and second conductive semiconductor layers 11 and 13. For example, the light emitting element LD may be configured as a stacked body. In various embodiments, the stacked body may be formed by successively stacking the first conductive semiconductor layer 11, the active layer 12, and the second conductive semiconductor layer 13.

In an embodiment, the light emitting element LD may have the form of a rod extending in one direction. For example, when the direction in which the light emitting element LD extends is defined as the longitudinal direction, the light emitting element LD may have a first end and a second end along the longitudinal direction.

In an embodiment, one of the first semiconductor layer 11 and the second conductive semiconductor layers 13 may be on the first end of the light emitting element LD, and the other of the first semiconductor layer 11 and the second conductive semiconductor layer 13 may be on the second end of the light emitting element LD.

In an embodiment, the light emitting element LD may be fabricated in a rod-like shape. In various embodiments, the term "rod type" may include a rod-like shape or a bar-like shape such as a cylindrical shape and a prismatic shape extending in a longitudinal direction (i.e., to have an aspect ratio greater than 1), and the cross-sectional shape thereof is not limited to a particular shape (e.g., the cross-sectional shape may include a circular shape, an oval shape, a polygon shape, etc.). For example, a length L of the light emitting element LD may be greater than a diameter D thereof (or a width of the cross-section thereof).

In an embodiment, the light emitting element LD may have a small size corresponding to a micro-scale or nano-scale size (e.g., the length L and/or the diameter D may correspond to a micro-scale or nano-scale size). However, the size of the light emitting element LD is not limited to a micro or nano scale. For example, the size of the light emitting element LD may be changed in various ways depending on design conditions. For example, the design conditions may not only be related to a light emitting display device, but also to various light emitting devices using the light emitting element LD.

The first conductive semiconductor layer 11 may include, for example, at least one n-type semiconductor layer. For example, the first conductive semiconductor layer 11 may include one n-type semiconductor layer. In various embodiments, the n-type semiconductor layer may, for example, include any one semiconductor material of InAlGaN, GaN, AlGaN, InGaN, AlN, and InN, and may be doped with a first conductive dopant such as Si, Ge, or Sn. However, the material forming the first conductive semiconductor layer 11 is not limited to this, and the first conductive semiconductor layer 11 may be formed of various other materials.

The active layer 12 may be on the first conductive semiconductor layer 11 and have a single or multiple quantum well structure. In an embodiment, a cladding layer (not shown) doped with a conductive dopant may be formed on and/or under the active layer 12. For example, the cladding layer may be an AlGaN layer or an InAlGaN layer. In an embodiment, a material such as AlGaN or InAlGaN may be used to form the active layer 12, and various other materials may be used to form the active layer 12.

In an embodiment, when an electric field of a predetermined voltage or more is applied to the opposite ends of the light emitting element LD, the light emitting element LD emits light by coupling of electron-hole pairs in the active layer 12. Because light emission of the light emitting element LD can be controlled based on the foregoing principle, the light emitting element LD may be used as a light source of various light emitting devices as well as a pixel.

In an embodiment, the second conductive semiconductor layer 13 may be on the active layer 12 and include a semiconductor layer of a type different from that of the first conductive semiconductor layer 11. For example, the second conductive semiconductor layer 13 may include at least one p-type semiconductor layer. For example, the second conductive semiconductor layer 13 may include a p-type semiconductor layer which includes any one semiconductor material of InAlGaN, GaN, AlGaN, InGaN, AlN, and InN, and is doped with a second conductive dopant such as Mg. However, the material forming the second conductive semiconductor layer 13 is not limited to this, and the second conductive semiconductor layer 13 may be formed of various other suitable materials.

In an embodiment, the light emitting element LD may further include additional other components as well as the first conductive semiconductor layer 11, the active layer 12, and the second conductive semiconductor layer 13. For example, the light emitting element LD may further include at least one fluorescent layer, at least one active layer, at least one semiconductor layer and/or at least one electrode layer on and/or under the first conductive semiconductor layer 11, the active layer 12, and/or the second conductive semiconductor layer 13.

For example, as shown in FIG. 1A, the light emitting element LD may further include at least one electrode layer (e.g., a first electrode layer) 15 on one end (e.g., an upper surface) of the second conductive semiconductor layer 13. Furthermore, in an embodiment, as shown in FIG. 1B, the light emitting element LD may further include at least one other electrode layer (e.g., a second electrode layer) 16 on one end (e.g., a lower surface) of the first conductive semiconductor layer 11. Each of the electrode layers 15 and 16 may be an ohmic contact electrode, but it is not limited thereto. Furthermore, each of the electrode layers 15 and 16 may include metal or a metal oxide. For example, chrome (Cr), titanium (Ti), aluminum (Al), gold (Au), nickel (Ni), ITO, and an oxide or alloy thereof may be used alone or in combination with each other. However, the present disclosure is not limited to this. In an embodiment, the electrode layers 15 and 16 may be substantially transparent or translucent. Thereby, light generated from the light emitting element LD may be emitted to the outside after passing through the electrode layers 15 and 16.

In an embodiment of the present disclosure, the light emitting element LD may further include an insulating film 14. In an embodiment, the insulating film 14 may be formed to enclose an outer peripheral (e.g., circumferential) surface of at least the active layer 12. In addition, the insulating film 14 may further enclose at least portions of the first and second conductive semiconductor layers 11 and 13.

Although the light emitting element LD illustrated in FIG. 1A includes an insulating film 14 that does not fully surround the side surface of the cylindrical body (e.g., a portion thereof has been removed), it should be understood that a portion has been removed to clearly show the stacked structure of the light emitting element LD and that the insulating film 14 may enclose the entirety of the outer peripheral (e.g., circumferential) surface (e.g., a side surface of a cylindrical body) of the first conductive semiconductor layer 11, the active layer 12, and/or the second conductive semiconductor layer 13. For example, as shown in FIG. 1A, the insulating film 14 may allow only the electrode layer 15 on one end of the second conductive semiconductor layer 13 to be exposed to the outside, and may enclose the entirety of the side surface of the first conductive semiconductor layer 11, the active layer 12, and/or the second conductive semiconductor layer 13. Here, the insulating film 14 may allow at least the opposite ends of the light emitting element LD to be exposed to the outside. For example, the insulating film 14 may allow not only the electrode layer 15 on one end of the second conductive semiconductor layer 13 but also one end (e.g., a lower surface) of the first conductive semiconductor layer 11 to be exposed to the outside.

In an embodiment, as shown in FIG. 1B, in the case where the electrode layers 15 and 16 are on the respective opposite ends of the light emitting element LD, the insulating film 14 may allow at least a portion of each of the electrode layers 15 and 16 to be exposed to the outside. Alternatively, in an embodiment, the insulating film 14 may be omitted.

In an embodiment, the insulating film 14 may include a transparent insulating material. For example, the insulating film 14 may include at least one insulating material selected from the group consisting of $SiO_2$, $Si_3N_4$, $Al_2O_3$, and $TiO_2$, but it is not limited thereto. In other words, the material forming the insulating film 14 is not limited to a particular material, and the insulating film 14 may be formed of well-known various suitable insulating materials.

In an embodiment where the insulating film 14 is included on the light emitting element LD, the active layer 12 of the light emitting element LD may be prevented from short-circuiting with first and/or second pixel electrode (not shown), etc. Consequently, the electrical stability of the light emitting element LD may be secured.

Furthermore, the insulating film 14 formed on the surface of the light emitting element LD, may reduce the occurrence of defects on the surface of the light emitting element LD (e.g., the occurrence of defects may be reduced or minimized), whereby the lifetime and efficiency of the light emitting element LD may be improved. In addition, the insulating film 14 formed on each light emitting element LD may prevent adjacent light emitting elements from undesirably short circuiting. For example, when a plurality of light emitting elements LD are adjacent to each other, the light emitting elements LD may be prevented by the insulating film 14 from undesirably short-circuiting.

In an embodiment of the present disclosure, a surface treatment process may be performed to fabricate the light emitting element LD. For example, the light emitting element LD may be surface-treated (e.g., through a coating process) so that, when a plurality of light emitting elements LD are mixed with a fluidic solution and then supplied to each sub-pixel area, the light emitting elements LD can be evenly diffused rather than being unevenly aggregating in the solution.

The above-described light emitting device LD may be used as a light source in different types of light emitting devices including a light emitting display device. For example, at least one light emitting element LD may be in each pixel area of a light emitting display panel, thereby forming an emission unit of each pixel. Furthermore, the field of application of the light emitting element LD according to the present disclosure is not limited to a display device. For example, the light emitting element LD may also be used in other types of light emitting devices such as a lighting device, which requires a light source.

Figure 2:
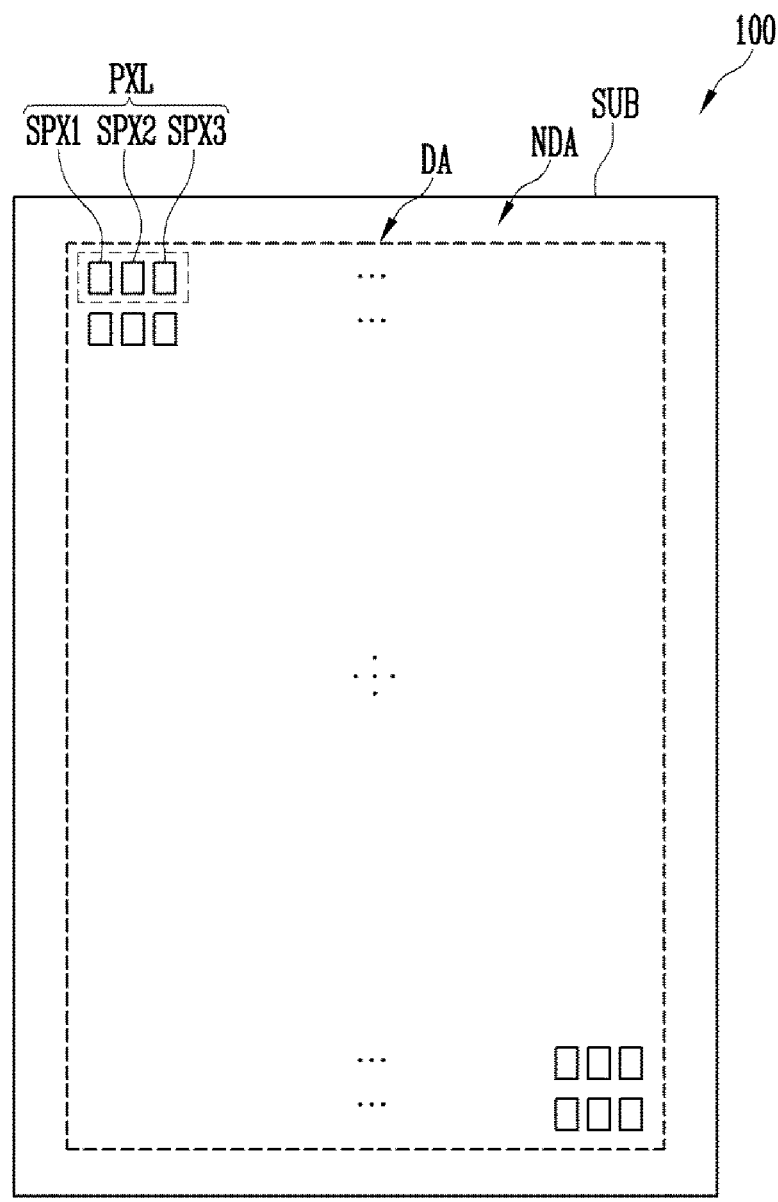
FIG. 2 is a plan view schematically illustrating a light emitting display panel in accordance with an embodiment of the present disclosure.

FIG. 2 is a plan view schematically illustrating a light emitting display panel 100 in accordance with an embodiment of the present disclosure. FIG. 2 illustrates the structure of the light emitting display panel 100 in accordance with the embodiment, focusing on a display area DA. In some embodiments, although not shown, at least one driving circuit unit (e.g., a scan driver and a data driver) and/or a plurality of lines may be included on the light emitting display panel 100.

Referring to FIG. 2, the light emitting display panel 100 may include a substrate SUB, and a plurality of pixels PXL on the substrate SUB. In detail, the light emitting display panel 100 may include a display area DA for displaying an image, and a non-display area NDA formed at an area (e.g., a predetermined area) other than the display area DA. The pixels PXL may be in the display area DA.

In an embodiment, the display area DA may be in a central portion of the light emitting display panel 100, and the non-display area NDA may be in a perimeter portion of the light emitting display panel 100 in such a way as to surround (e.g., around) the display area DA. The locations of the display area DA and the non-display area NDA are not limited to this, and the locations thereof may be changed.

The substrate SUB may be a rigid or flexible substrate, and the material or properties thereof are not particularly limited. For example, the substrate 110 may be a rigid substrate made of glass or reinforced glass, or a flexible substrate formed of a thin film made of plastic or metal. Furthermore, the substrate SUB may be a transparent substrate, but it is not limited thereto. For instance, the substrate SUB may be a translucent substrate, an opaque substrate, or a reflective substrate.

An area on the substrate SUB is defined as the display area DA in which the pixels PXL are formed, and the other area thereof is defined as the non-display area NDA. For example, the substrate SUB may include the display area DA including a plurality of pixel areas on which the respective pixels PXL are formed, and the non-display area NA around the display area DA. Various lines and/or internal circuit units (or circuits) which are coupled to the pixels PXL may be in the non-display area NDA.

Each of the pixels PXL may include at least one light emitting element LD (e.g., at least one rod-type light emitting diode shown in FIG. 1) which is driven by a corresponding scan signal and a corresponding data signal. For example, each pixel PXL may include a plurality of rod-type light emitting diodes, each of which has a small size corresponding to a micro-scale or nano-scale size, and which are coupled parallel to each other. The plurality of rod-type light emitting diodes may form a light source of each pixel PXL.

Furthermore, each of the pixels PXL may include a plurality of sub-pixels. For example, each pixel PXL may include a first sub-pixel SPX1, a second sub-pixel SPX2, and a third sub-pixel SPX3. In an embodiment, the first, second, and third sub-pixels SPX1, SPX2, and SPX3 may emit light of different colors. For instance, the first sub-pixel SPX1 may be a red sub-pixel for emitting red light, the second sub-pixel SPX2 may be a green sub-pixel for emitting green light, and the third sub-pixel SPX3 may be a blue sub-pixel for emitting blue light. However, the colors, types and/or number of sub-pixels forming each pixel PXL are not particularly limited. For example, the color of light which is emitted from each sub-pixel may be changed in various ways. Although in FIG. 2 there is illustrated an embodiment where the pixels PXL are arranged in the display area DA in a stripe shape, the present disclosure is not limited thereto. For instance, the display area DA may have one or more of various well-known suitable pixel arrangement shapes.

In an embodiment, each pixel PXL (or each sub-pixel) may be formed of an active pixel. However, the types, structures, and/or driving schemes of the pixels PXL capable of being applied to the present disclosure are not particularly limited. For example, each pixel PXL may be formed of a pixel of a light emitting display device which has various well-known suitable active or passive structures.

Figure 3A:
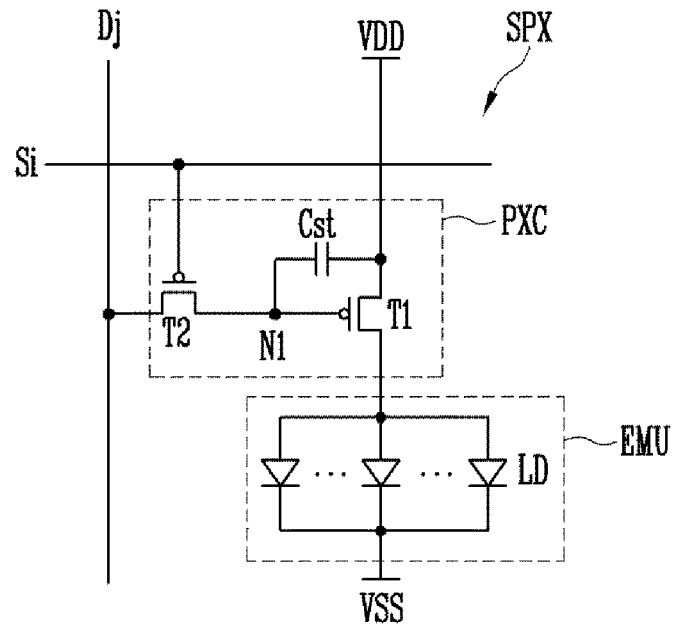
FIGS. 3A-3C are circuit diagrams each illustrating a sub-pixel in accordance with an embodiment of the present disclosure.
Figure 3B:
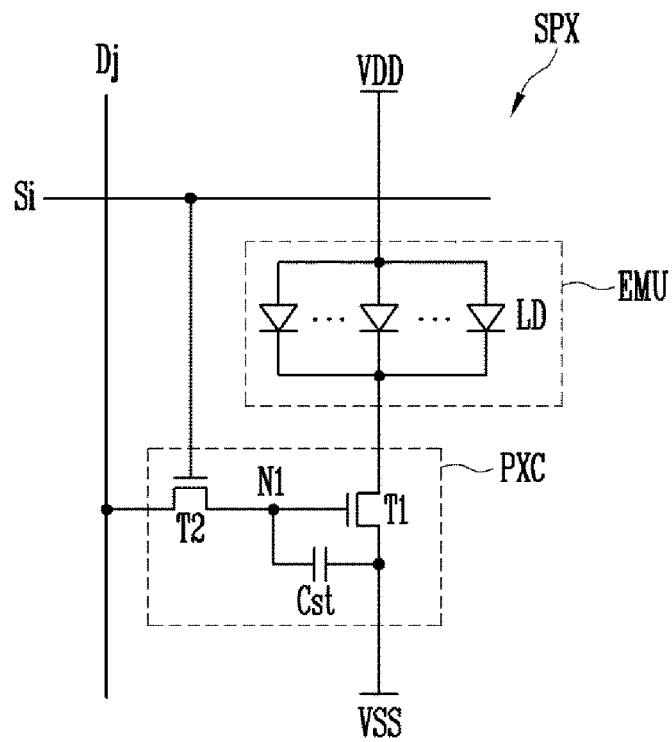
Figure 3C:
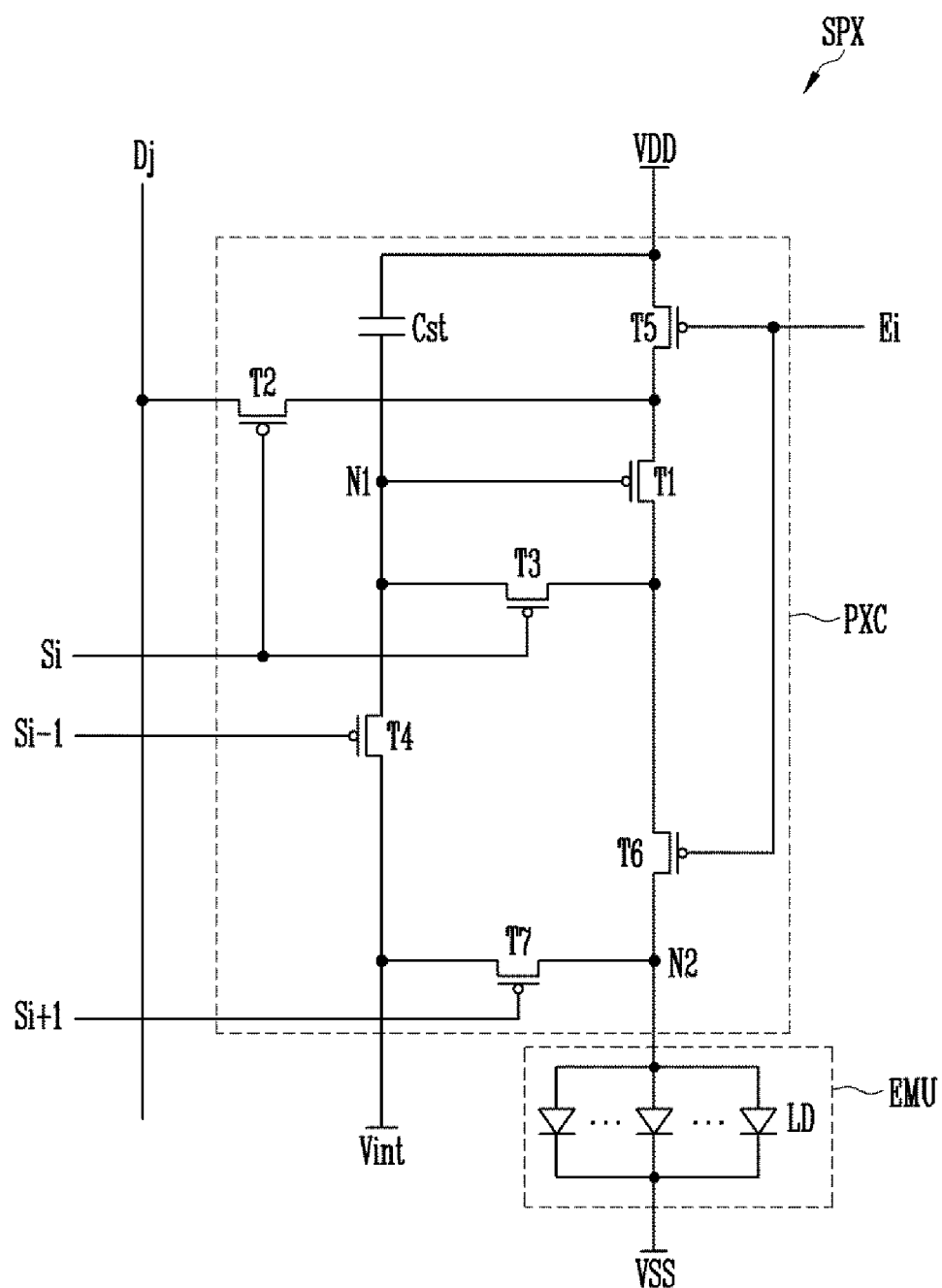

FIGS. 3A-3C are circuit diagrams each illustrating a sub-pixel in accordance with an embodiment of the present disclosure, for example, to illustrate any one of the first, second, and third sub-pixels SPX1, SPX2, and SPX3 shown in FIG. 2.

In detail, FIGS. 3A-3C illustrate different embodiments of a sub-pixel which may be provided in an active light emitting display device. For example, each sub-pixel SPX shown in FIGS. 3A-3C may be any one of the first, second, and third sub-pixels SPX1, SPX2, and SPX3 provided in the light emitting display panel 100 of FIG. 2. The structures of the first, second, and third sub-pixels SPX1, SPX2, and SPX3 may be substantially identical or similar to each other. Therefore, in FIGS. 3A-3C, the first, second, and third sub-pixels SPX1, SPX2, and SPX3 will be collectively referred to as "sub-pixel SPX", where the sub-pixel SPX designates one of the first, second, and third sub-pixels SPX1, SPX2, and SPX3.

Referring to FIG. 3A, the sub-pixel SPX in accordance with an embodiment of the present disclosure may include an emission unit EMU configured to generate light having a luminance corresponding to a data signal, and a pixel circuit PXC configured to drive the emission unit EMU.

In an embodiment, the emission unit EMU may include a plurality of light emitting elements LD coupled in parallel to each other between first and second power supplies VDD and VSS. Here, the first and second power supplies VDD and VSS may have different potentials to make it possible for the light emitting elements LD to emit light. For example, the first power supply VDD may be set as a high-potential power supply, and the second power supply VSS may be set as a low-potential power supply. Here, a difference in potential between the first and second power supplies VDD and VSS may be set to a threshold voltage of the light emitting elements LD or more during a light emitting period of the sub-pixel SPX.

Although in FIG. 3A there is illustrated an embodiment in which the light emitting elements LD forming the emission unit EMU are coupled in parallel to each other in the same direction (e.g., in a forward direction) between the first power supply VDD and the second power supply VSS, however, the present disclosure is not limited to the depicted configuration. For example, in an embodiment, some of the light emitting elements LD may be coupled to each other in the forward direction between the first and second power supplies VDD and VSS, and the other light emitting elements LD may be coupled to each other in the reverse direction. Alternatively, in an embodiment, at least one sub-pixel SPX may include only a single light emitting element LD.

In an embodiment, first ends of the light emitting elements LD forming each emission unit EMU may be coupled in common to a corresponding pixel circuit PXC through a first electrode, and may be coupled to the first power supply VDD through the pixel circuit PXC. Second ends of the light emitting elements LD may be coupled in common to the second power supply VSS through a second electrode. Hereinafter, the first electrode and the second electrode in each emission unit EMU will be respectively referred to as a "first pixel electrode" and a "second pixel electrode".

Each emission unit EMU may emit light having a luminance corresponding to a driving current supplied thereto through the corresponding pixel circuit PXC. Thereby, an image may be displayed on the display area DA.

The pixel circuit PXC may be coupled to a scan line Si and a data line Dj of the corresponding sub-pixel SPX. For example, if the sub-pixel SPX is located on an i-th row and a j-th column of the display area DA, the pixel circuit PXC of the sub-pixel SPX may be coupled to the i-th scan line Si and the j-th data line Dj of the display area DA. The pixel circuit PXC may include a first transistor T1, a second transistor T2, and a storage capacitor Cst.

A first electrode of the first transistor (driving transistor; T1) is coupled to the first power supply VDD, and a second electrode thereof is coupled to the light emitting elements LD through the first pixel electrode (i.e., the first electrode of the corresponding emission unit EMU). Here, the first electrode and the second electrode may be different electrodes. For example, if the first electrode is a source electrode, the second electrode may be a drain electrode. A gate electrode of the first transistor T1 is coupled to the first node N1. The first transistor T1 may control driving current to be supplied to the emission unit EMU in response to a voltage of the first node N1.

A first electrode of the second transistor (switching transistor; T2) is coupled to the data line Dj, and a second electrode thereof is coupled to the first node N1. A gate electrode of the second transistor T2 is coupled to the scan line Si.

When a scan signal of a gate-on voltage (e.g., a low voltage) is supplied from the scan line Si, the second transistor T2 is turned on to electrically connect the first node N1 to the data line Dj. During each frame period, a data signal of a corresponding frame is supplied to the data line Dj. The data signal is transmitted to the first node N1 via the second transistor T2. Thereby, voltage corresponding to the data signal is charged to the storage capacitor Cst.

One electrode of the storage capacitor Cst is coupled to the first power supply VDD, and the other electrode thereof is coupled to the first node N1. The storage capacitor Cst may charge voltage corresponding to a data signal supplied to the first node N1 during each frame period, and maintain the charged voltage until a data signal of a subsequent frame is supplied.

Although in FIG. 3A the transistors, e.g., the first and second transistors T1 and T2, included in the pixel circuit PXC have been illustrated as being formed of P-type transistors, the present disclosure is not limited to this. In other words, any one of the first and second transistors T1 and T2 may be changed to an N-type transistor, provided that the circuit configuration and applied voltages are also changed accordingly, as those skilled in the art would appreciate.

For example, as shown in FIG. 3B, both the first and second transistors T1 and T2 may be formed of N-type transistors. The configuration and operation of the sub-pixel SPX shown in FIG. 3B, other than the fact that connection positions of some circuit elements have been changed depending on a change in type of the transistors, are substantially similar to those of the sub-pixel SPX of FIG. 3A. Therefore, detailed description of the sub-pixel SPX of FIG. 3B will be omitted.

The structure of the pixel circuit PXC is not limited to the embodiments shown in FIGS. 3A and 3B. In other words, the pixel circuit PXC may be formed of a well-known pixel circuit which may have various suitable structures and/or be operated by various suitable driving schemes. For example, the pixel circuit PXC may be configured in the same manner as that of an embodiment shown in FIG. 3C.

Referring to FIG. 3C, the pixel circuit PXC may be coupled not only to a scan line Si of a corresponding horizontal line but also to at least one another scan line (or a control line). For example, the pixel circuit PXC of the sub-pixel SPX on the i-th row of the display area DA may be further coupled to an i−1-th scan line Si−1 and/or an i+1-th scan line Si+1. In an embodiment, the pixel circuit PXC may be coupled not only to the first and second power supplies VDD and VSS but also to other power supplies. For instance, the pixel circuit PXC may also be coupled to an initialization power supply Vint. In an embodiment, the pixel circuit PXC may include first to seventh transistors T1 to T7 and a storage capacitor Cst.

A first electrode of the first transistor T1 is coupled to the first power supply VDD via the fifth transistor T5, and a second electrode thereof is coupled to the light emitting elements LD via the sixth transistor T6. A gate electrode of the first transistor T1 may be coupled to a first node N1. The first transistor T1 may control driving current to be supplied to the emission unit EMU in response to a voltage of the first node N1.

The second transistor T2 is coupled between the data line Dj and the first electrode of the first transistor T1. A gate electrode of the second transistor T2 is coupled to the corresponding scan line Si. When a scan signal of a gate-on voltage is supplied from the scan line Si, the second transistor T2 may be turned on to electrically connect the data line Dj to the first electrode of the first transistor T1. Hence, if the second transistor T2 is turned on, a data signal supplied from the data line Dj may be transmitted to the first transistor T1.

The third transistor T3 is coupled between the second electrode of the first transistor T1 and the first node N1. A gate electrode of the third transistor T3 is coupled to the corresponding scan line Si. When a scan signal of a gate-on voltage is supplied from the scan line Si, the third transistor T3 may be turned on to electrically connect the second electrode of the first transistor T1 to the first node N1. Therefore, if the third transistor T3 is turned on, the first transistor T1 may be connected in the form of a diode.

The fourth transistor T4 may be coupled between the first node N1 and the initialization power supply Vint. A gate electrode of the fourth transistor T4 is coupled to, e.g., the i−1-th scan line Si−1. When a scan signal of a gate-on voltage is supplied to the i−1-th scan line Si−1, the fourth transistor T4 may be turned on so that the voltage of the initialization power supply Vint may be transmitted to the first node N1. Here, the voltage of the initialization power supply Vint may be a minimum voltage of a data signal or less.

The fifth transistor T5 is coupled between the first power supply VDD and the first transistor T1. A gate electrode of the fifth transistor T5 is coupled to a corresponding emission control line, e.g., an i-th emission control line Ei. The fifth transistor T5 may be turned off when an emission control signal of a gate-off voltage (e.g., a high voltage) is supplied to the emission control line Ei, and may be turned on in other cases.

The sixth transistor T6 is coupled between the first transistor T1 and the light emitting elements LD. A gate electrode of the sixth transistor T6 is coupled to a corresponding emission control line, e.g., the i-th emission control line Ei. The sixth transistor T6 may be turned off when an emission control signal of a gate-off voltage is supplied to the emission control line Ei, and may be turned on in other cases.

The seventh transistor T7 is coupled between the emission unit EMU (e.g., the first pixel electrode coupled to the first ends of the light emitting elements LD) and the initialization power supply Vint. A gate electrode of the seventh transistor T7 is coupled to any one of scan lines of a subsequent stage, e.g., to the i+1-th scan line Si+1. When a scan signal of a gate-on voltage is supplied to the i+1-th scan line Si+1, the seventh transistor T7 may be turned on so that the voltage of the initialization power supply Vint may be supplied to the first pixel electrode.

The storage capacitor Cst is coupled between the first power supply VDD and the first node N1. The storage capacitor Cst may store a voltage corresponding both to the data signal applied to the first node N1 during each frame period and to the threshold voltage of the first transistor T1.

Although in FIG. 3C the transistors, e.g., the first to seventh transistors T1 to T7, included in the pixel circuit PXC have been illustrated as being formed of P-type transistors, the present disclosure is not limited to this. For example, at least one of the first to seventh transistors T1 to T7 may be changed to an N-type transistor, provided that the circuit configuration and applied voltage are also changed accordingly, as those skilled in the art would appreciate.

Furthermore, the structure of the sub-pixel SPX which may be applied to the present disclosure is not limited to the embodiments shown in FIGS. 3A-3C, and each sub-pixel SPX may have various other suitable structures. For example, the pixel circuit PXC included in each sub-pixel SPX may be formed of a well-known pixel circuit which may have various suitable structures and/or be operated by various suitable driving schemes. In an embodiment of the present disclosure, each sub-pixel SPX may be configured in a passive light emitting display device. In this case, the pixel circuit PXC may be omitted, and each of the first and second pixel electrodes of the emission unit EMU may be directly coupled to the scan line Si, the data line Dj, a power line, and/or the control line.

Figure 4:
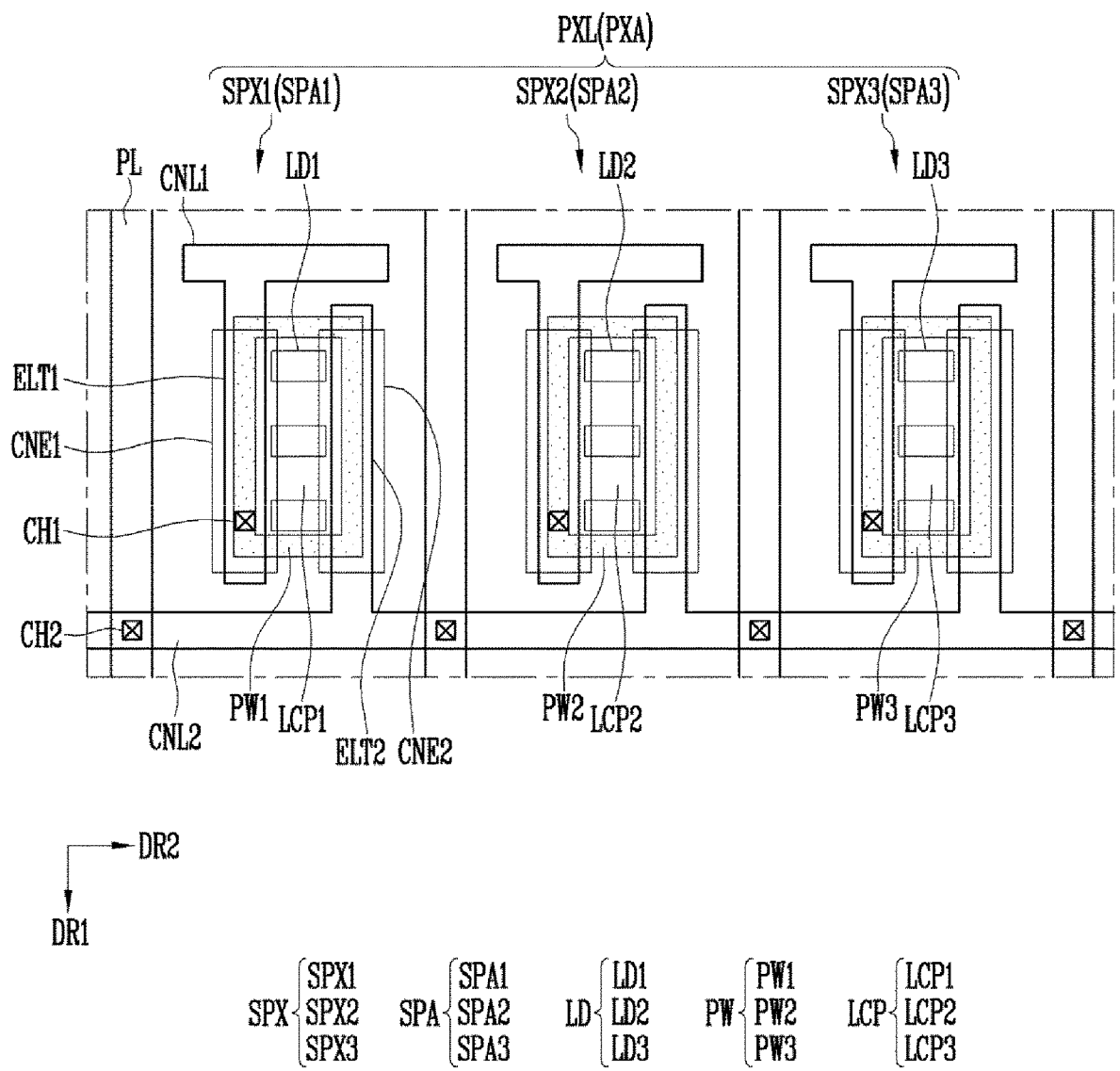
FIGS. 4-6 are plan views each illustrating the structure of a light emitting display panel in accordance with an embodiment of the present disclosure.
Figure 5:
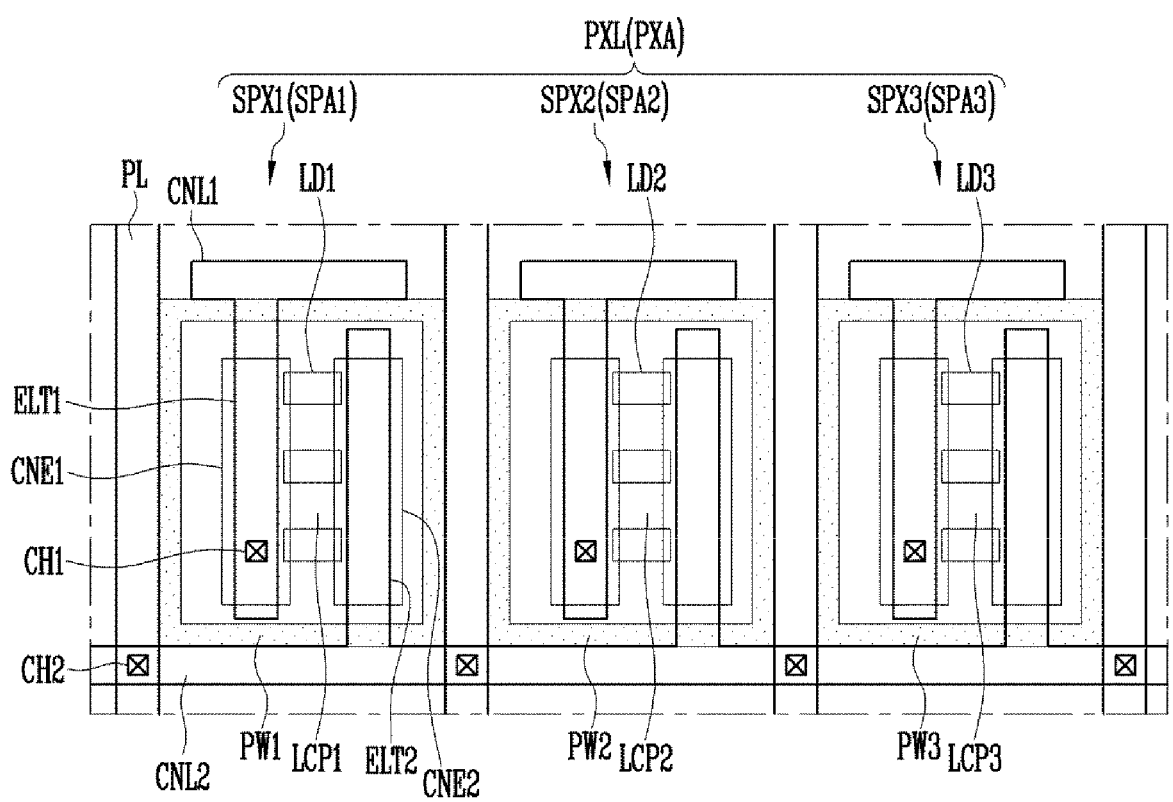
Figure 6:
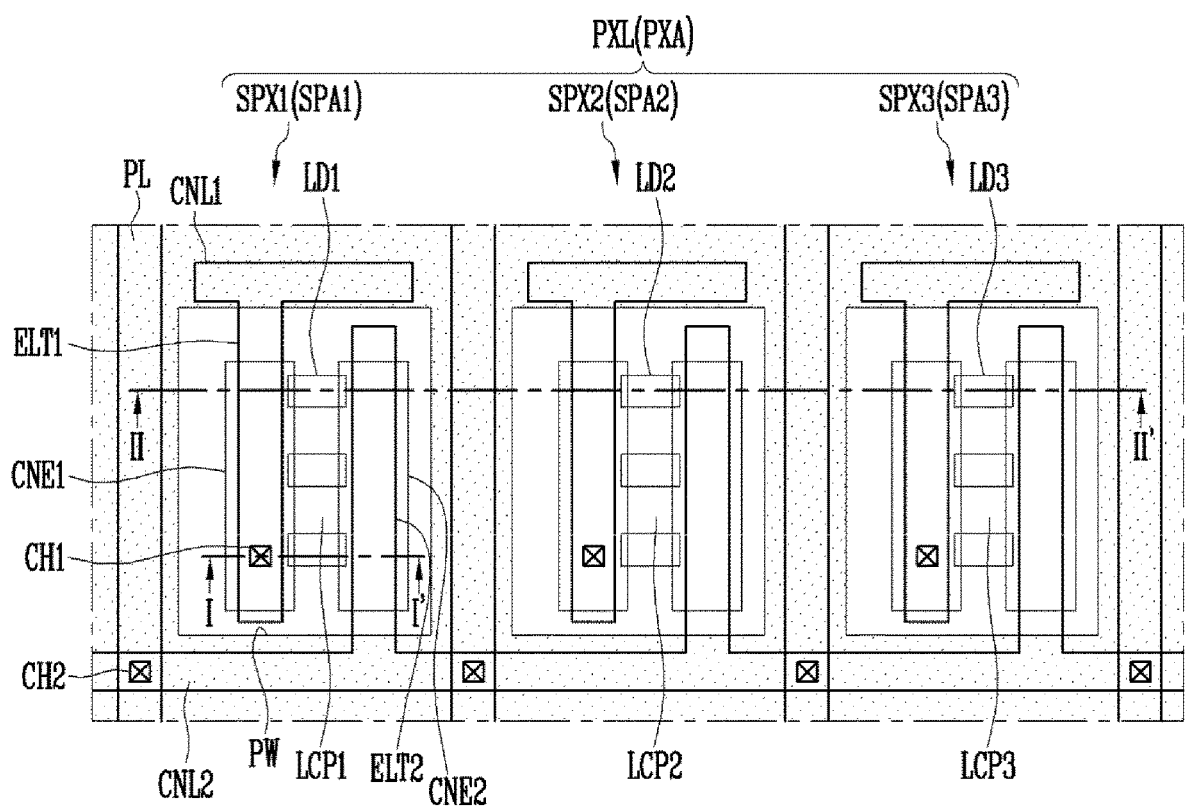

FIGS. 4-6 are plan views each illustrating the structure of a light emitting display panel (100 of FIG. 2) in accordance with an embodiment of the present disclosure, for example, to illustrate any one pixel area PXA of the pixels PXL shown in FIGS. 2-3C. FIGS. 4-6 illustrate the structure of each pixel PXL based on a display element layer of the pixel PXL; for example, the illustration of a layout of the pixel circuit PXC will be omitted. Furthermore, in FIGS. 4-6, the structure of the pixel PXL is simply illustrated. For example, each electrode is illustrated as having only a single layer structure, however, the present disclosure is not limited to the depicted structure. For instance, at least one of the electrodes shown in FIGS. 4 to 6 may have a multi-layer structure. In some embodiments, although not shown, each pixel area PXA may have at least one conductive layer and/or at least one insulating layer.

Referring to FIGS. 4-6, each pixel area PXA may include a plurality of sub-pixel areas SPA respectively corresponding to a plurality of sub-pixels SPX which form a corresponding pixel PXL. For example, each pixel area PXA may include a first sub-pixel area SPA1 in which a first sub-pixel SPX1 is formed, a second sub-pixel area SPA2 in which a second sub-pixel SPX2 is formed, and a third sub-pixel area SPA3 in which a third sub-pixel SPX3 is formed.

Each sub-pixel area SPA may include a first pixel electrode ELT1, a second pixel electrode ELT2, and a plurality of light emitting elements LD coupled between the first and second pixel electrodes ELT1 and ELT2. However, the present disclosure is not limited to the depicted embodiment. For example, in an embodiment of the present disclosure, at least one sub-pixel area SPA may include only a single light emitting element LD.

In an embodiment, the first pixel electrode ELT1 and the second pixel electrode ELT2 may be spaced apart from each other and positioned such that at least portions thereof face each other. For example, in each sub-pixel area SPA, the first and second pixel electrodes ELT1 and ELT2 may extend in a first direction DR1 and parallel to each other at positions spaced apart from each other (e.g., spaced apart from each other by a predetermined distance) in a second direction DR2. However, the present disclosure is not limited to this positioning. For example, the shapes and/or the mutual disposition relationship of the first and second pixel electrodes ELT1 and ELT2 may be changed in various suitable ways as those skilled in the art would appreciate.

In an embodiment, the first pixel electrode ELT1 may be coupled to the pixel circuit of the corresponding sub-pixel SPX, e.g., to the pixel circuit PXC shown in any one of FIGS. 3A-3C, through a first contact hole CH1. In an embodiment, each pixel circuit PXC may be under the light emitting elements LD in the corresponding sub-pixel area SPA. For example, each pixel circuit PXC may be formed on a pixel circuit layer under the light emitting elements LD.

In an embodiment, the first pixel electrode ELT1 may be coupled to a first connection electrode CNL1. For instance, the first pixel electrode ELT1 may be integrally coupled to (or formed with) the first connection electrode CNL1. For example, the first pixel electrode ELT1 may be formed of at least one branch diverging from the first connection electrode CNL1. However, the present disclosure is not limited to the first pixel electrode ELT1 and the first connection electrode CNL1 being integrally coupled. For example, in an embodiment, the first pixel electrode ELT1 and the first connection electrode CNL1 may be separately formed from each other and electrically coupled to each other through, e.g., at least one contact hole or via hole.

In an embodiment, the first pixel electrode ELT1 and the first connection electrode CNL1 may extend in different directions in the corresponding sub-pixel area SPA. For example, when the first pixel electrode ELT1 extends in the first direction DR1, the first connection electrode CNL1 may extend in the second direction DR2 intersecting with the first direction DR1.

In an embodiment, the second pixel electrode ELT2 may be coupled to the second power supply VSS. For example, the second pixel electrode ELT2 may be coupled to the second pixel power supply VSS via a second connection electrode CNL2, a second contact hole CH2, and a power line PL. In an embodiment, a portion of the power line PL for supplying the second power supply VSS may be on the pixel circuit layer under the light emitting elements LD, but it is not limited thereto.

In an embodiment, the second pixel electrode ELT2 and the second connection electrode CNL2 may extend in different directions in the corresponding sub-pixel area SPA. For example, when the second pixel electrode ELT2 extends in the first direction DR1, the second connection electrode CNL2 may extend in the second direction DR2.

In an embodiment, the second pixel electrode ELT2 and the second connection electrode CNL2 may be integrally coupled to (or formed with) each other. For example, the second pixel electrode ELT2 may be formed of at least one branch diverging from the second connection electrode CNL2. However, the present disclosure is not limited to the second pixel electrode ELT2 and the second connection electrode CNL2 being integrally coupled. For example, in an embodiment, the second pixel electrode ELT2 and the second connection electrode CNL2 may be formed separately from each other and electrically coupled to each other through, e.g., at least one contact hole or via hole.

In an embodiment, at least one light emitting element LD, e.g., a plurality of light emitting elements LD, may be between the first and second pixel electrodes ELT1 and ELT2 of each sub-pixel SPX. For example, at least one first light emitting element LD may be between the first and second pixel electrodes ELT1 and ELT2 of the first sub-pixel SPX1. At least one second light emitting element LD may be between the first and second pixel electrodes ELT1 and ELT2 of the second sub-pixel SPX2. At least one third light emitting element LD may be between the first and second pixel electrodes ELT1 and ELT2 of the third sub-pixel SPX3. For example, in each sub-pixel area SPA, a plurality of light emitting elements LD may be coupled in parallel to each other in a region (e.g., an emission region of the corresponding sub-pixel SPX) in which the first pixel electrode ELT1 and the second pixel electrode ELT2 are facing each other.

Although in FIGS. 4-6 all of the light emitting elements LD have been illustrated as being arranged in the second direction DR2, e.g., in the horizontal direction, the arrangement direction of the light emitting elements LD is not limited thereto. For example, at least one of the light emitting elements LD may be arranged along a diagonal direction.

In an embodiment, the first, second, and third light emitting elements LD1, LD2, and LD3 may emit light of the same color or different colors. For example, all of the first, second, and third light emitting elements LD1, LD2, and LD3 may be formed of blue light emitting diodes, which emit blue light.

The light emitting elements LD are electrically coupled between the first and second pixel electrodes ELT1 and ELT2 of the corresponding sub-pixel SPX. For example, one end (hereinafter, referred to as "first end") of each light emitting element LD may be electrically coupled to the first pixel electrode ELT1 of the corresponding sub-pixel SPX, and the other end (hereinafter, referred to as "second end") of the light emitting element LD may be electrically coupled to the second pixel electrode ELT2 of the corresponding sub-pixel SPX.

In an embodiment, the first ends of the light emitting elements LD may be electrically coupled to the corresponding first pixel electrode ELT1 through at least one contact electrode, e.g., a first contact electrode CNE1, rather than being directly on the first pixel electrode ELT1. However, the present disclosure is not limited to this. For example, the first ends of the light emitting elements LD may come into direct contact with the corresponding first pixel electrode ELT1 and be electrically coupled to the first pixel electrode ELT1.

Similarly, the second ends of the light emitting elements LD may be electrically coupled to the corresponding second pixel electrode ELT2 through at least one contact electrode, e.g., a second contact electrode CNE2, rather than being directly on the second pixel electrode ELT2. However, the present disclosure is not limited to this. For example, the second ends of the light emitting elements LD may come into direct contact with the corresponding second pixel electrode ELT2 and be electrically coupled to the second pixel electrode ELT2.

In an embodiment, each of the light emitting elements LD may be formed of a light emitting diode which is made of material having an inorganic crystal structure and has a subminiature size, e.g., corresponding to a micro-scale or nano-scale size. For example, each of the first, second, and third light emitting elements LD1, LD2, and LD3 may be formed of a subminiature rod-type light emitting diode having a size corresponding to a micro-scale or nano-scale size, as shown in FIG. 1.

In an embodiment, the light emitting elements LD may be prepared in a diffused form (e.g., in a predetermined solution), and then supplied to the emission region of each sub-pixel SPX by an inkjet printing scheme or the like. For example, the light emitting elements LD may be mixed with a volatile solvent and supplied to each emission region. Here, if a voltage (e.g., a predetermined voltage) is supplied to each sub-pixel SPX through the first and second pixel electrodes ELT1 and ELT2, an electric field is formed between the first and second pixel electrodes ELT1 and ELT2, whereby the light emitting elements LD are self-aligned between the first and second pixel electrodes ELT1 and ELT2. After the light emitting elements LD have been aligned, the solvent may be removed by a volatilization scheme or other schemes. In this way, the light emitting elements LD may be reliably arranged between the first and second pixel electrodes ELT1 and ELT2. Furthermore, because the first contact electrode CNE1 and the second contact electrode CNE2 are respectively formed on the first and second ends of the light emitting elements LD, the light emitting elements LD may be reliably coupled between the first and second pixel electrodes ELT1 and ELT2.

In an embodiment, each first contact electrode CNE1 may be formed to cover both the first ends of the light emitting elements LD and at least a portion of the corresponding first pixel electrode ELT1, whereby the first ends of the light emitting elements LD may be physically and/or electrically coupled to the first pixel electrode ELT1. Similarly, each second contact electrode CNE2 may be formed to cover both the second ends of the light emitting elements LD and at least a portion of the corresponding second pixel electrode ELT2, whereby the second ends of the light emitting elements LD may be physically and/or electrically coupled to the second pixel electrode ELT2.

The light emitting elements LD in each sub-pixel area SPA may gather, thus forming a light source of the corresponding sub-pixel SPX. For example, if a driving current flows through at least one sub-pixel SPX during each frame period, the light emitting elements LD that are coupled in the forward direction between the first and second pixel electrodes ELT1 and ELT2 of the sub-pixel SPX may emit light having a luminance corresponding to the driving current.

In an embodiment, the light emitting elements LD in each sub-pixel SPX may be enclosed by a partition wall PW. For example, at least in a plan view, at least one light emitting element LD in the emission region of each sub-pixel area SPA may be enclosed by (or surrounded by) the partition wall PW in the corresponding sub-pixel area SPA.

For example, as shown in FIGS. 4 and 5, at least one first light emitting element LD1 in the emission region of the first sub-pixel area SPA1 may be enclosed by (or surrounded by) a first partition wall PW1 in the first sub-pixel area SPA1. Similarly, at least one second light emitting element LD2 in the emission region of the second sub-pixel area SPA2 may be enclosed by (or surrounded by) a second partition wall PW2 in the second sub-pixel area SPA2. At least one third light emitting element LD3 in the emission region of the third sub-pixel area SPA3 may be enclosed by (or surrounded by) a third partition wall PW3 in the third sub-pixel area SPA3.

In an embodiment, as shown in FIG. 4, each partition wall PW may have a relatively small periphery capable of enclosing only the emission region of the corresponding sub-pixel area SPA, and may be individually located in the corresponding sub pixel area SPA. Alternatively, as shown in FIG. 5, each partition wall PW may have a comparatively extended periphery in the corresponding sub-pixel area SPA, and may be individually located in the corresponding sub pixel area SPA.

In other words, in some embodiments, the first, second, and third partition walls PW1, PW2, and PW3 may be configured of respective individual patterns formed separately from each other. However, the present disclosure is not limited to separately formed patterns. For example, as shown in FIG. 6, the first, second, and third partition walls PW1, PW2, and PW3 may be integrated into one partition wall PW integrally coupled to each other. For instance, the partition wall PW may have a mesh shape to expose the emission region of each sub-pixel area SPA, and may be formed in an integrated form in the entirety of the display area DA of FIG. 2. In other words, the partition wall PW may be an integrated or separate partition wall.

Although FIGS. 4-6 illustrate examples where the partition wall PW has a rectangular shape or a rectangular mesh shape, the shape of the partition wall PW is not limited thereto. For example, in embodiments of the present disclosure, the partition wall PW may have various suitable peripheral shapes corresponding not only to a rectangular shape but also to a polygonal shape, a circular shape, an elliptical shape, or a combination thereof. In other words, for example, the shape, size, and/or arrangement structure of the partition wall PW may be changed in various suitable ways depending on the embodiments.

In an embodiment, the partition wall PW may include at least one organic layer formed of photoresist-based organic material, and/or at least one inorganic layer formed of inorganic material such as $SiN_x$ or $SiO_x$. For example, the partition wall PW may have a single-layer structure formed of a single organic layer or a single inorganic layer. Alternatively, in an embodiment, the partition wall PW may have a multi-layer structure including one or more organic layers and one or more inorganic layers, whereby the height of the partition wall PW may be easily adjusted.

In an embodiment, a reflective layer, etc., may be additionally provided on a surface of the partition wall PW. In this case, light emitted from the light emitting elements LD may be efficiently used, whereby the optical efficiency of the sub-pixels SPX may be improved.

In an embodiment of the present disclosure, a light conversion pattern LCP may be selectively positioned in the emission region of each sub-pixel area SPA that is enclosed by the partition wall PW. For example, a first light conversion pattern LCP1 may be positioned over at least a portion of the first light emitting elements LD1 of the first sub-pixel area SPA1, a second light conversion pattern LCP2 may be positioned over at least a portion of the second light emitting elements LD2 of the second sub-pixel area SPA2, and a third light conversion pattern LCP3 may be positioned over at least a portion of the third light emitting elements LD3 of the third sub-pixel area SPA3. Each light conversion pattern LCP may include at least one of a color conversion layer, a light scattering layer, and a color filter, and detailed description thereof will be made later herein.

Figure 7:
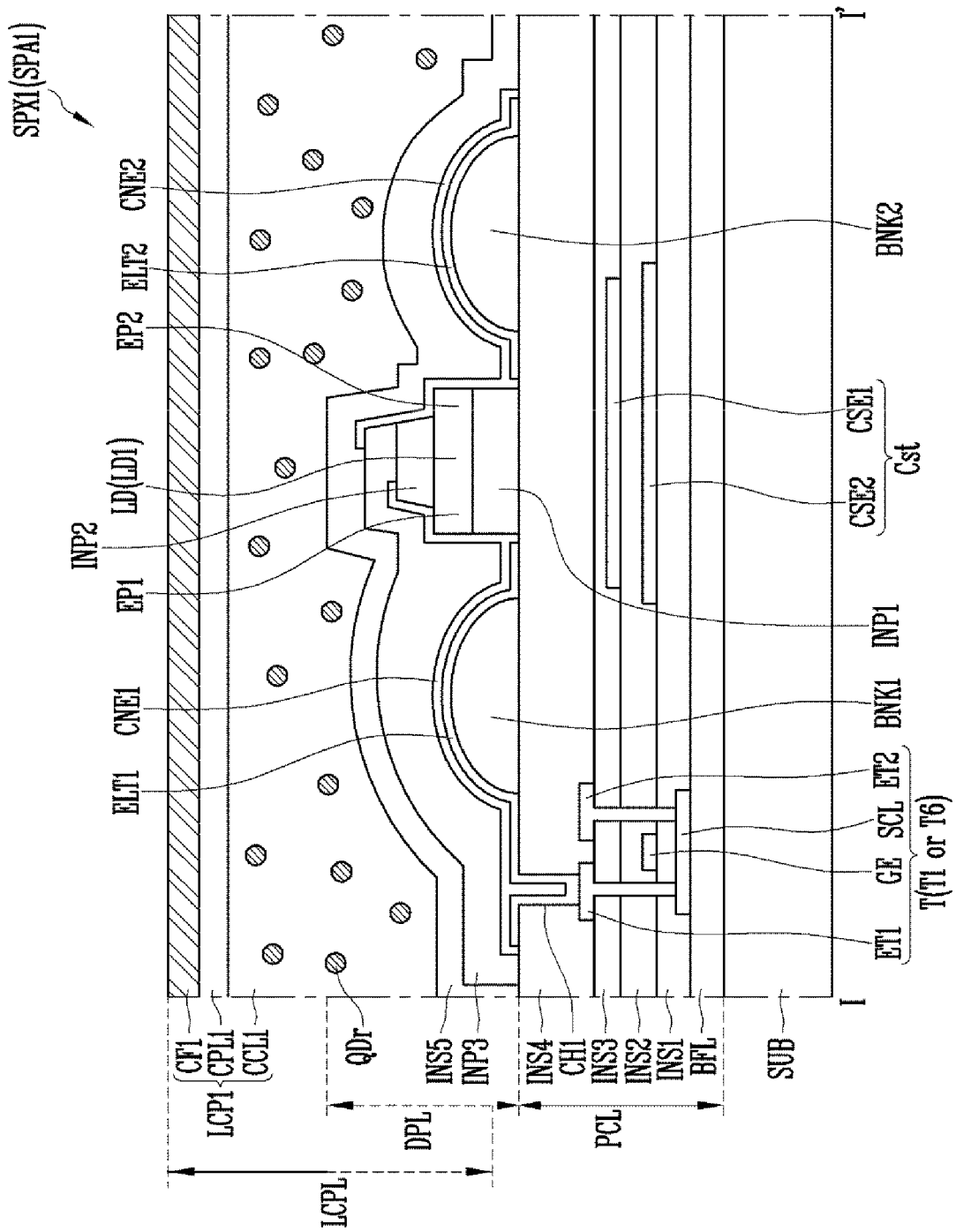
FIGS. 7-9 are sectional views each illustrating the structure of a sub-pixel in accordance with an embodiment of the present disclosure.
Figure 8:
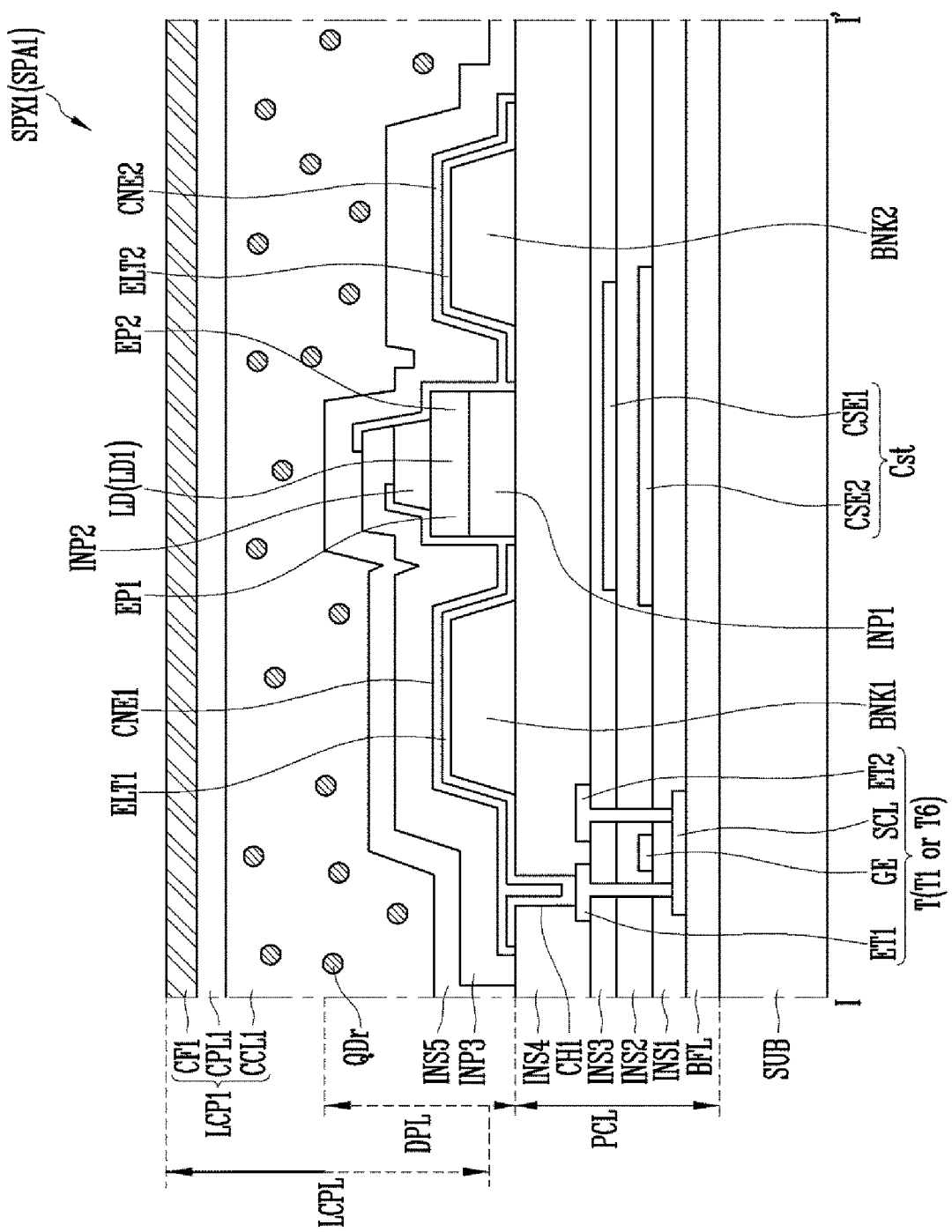
Figure 9:
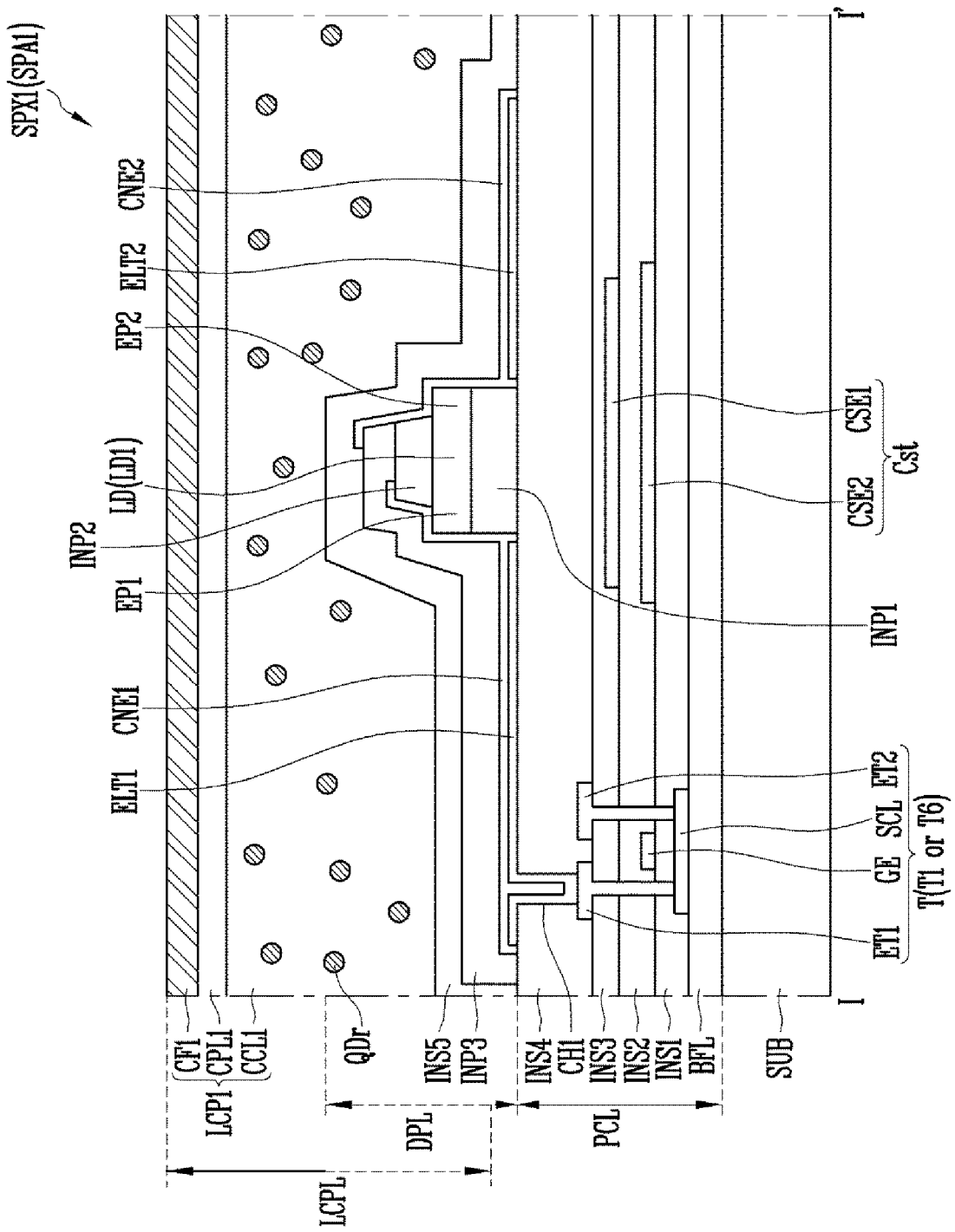

FIGS. 7-9 are sectional views each illustrating the structure of the sub-pixel SPX in accordance with an embodiment of the present disclosure. For example, FIGS. 7-9 are sectional views taken along the line I-I' of FIG. 6 in accordance with different embodiments. In an embodiment, the cross-sectional structures of the first, second, and third sub-pixels SPX1, SPX2, and SPX3 described above may be substantially identical or similar to each other. For example, the first, second, and third sub-pixels SPX1, SPX2, and SPX3 may have different light conversion patterns LCP, and the configurations thereof other than this may be substantially identical or similar to each other. For the sake of description, with reference to FIGS. 7-9 illustrating the cross-section of the first sub-pixel SPX1 corresponding to the line I-I' of FIG. 6, the structure of each sub-pixel SPX will be comprehensively described.

Referring to FIGS. 7-9 along with FIGS. 1-6, a pixel circuit layer PCL, a display element layer DPL, and a light conversion pattern layer LCPL are successively formed in each pixel area PXA on the substrate SUB. In an embodiment, the pixel circuit layer PCL, the display element layer DPL, and the light conversion pattern layer LCPL may be formed on the entirety of the display area DA of the light emitting display panel 100.

The pixel circuit layer PCL may include circuit elements that form the pixel circuits PXC of the sub-pixels SPX. The display element layer DPL may include the light emitting elements LD of the sub-pixels SPX. The light conversion pattern layer LCPL may include the light conversion patterns LCP of the sub-pixels SPX.

For example, in the first sub-pixel area SPA1 of the substrate SUB, a pixel circuit layer PCL including circuit elements that form the pixel circuit PXC of the first sub-pixel SPX1, a display element layer DPL including at least one light emitting element LD, e.g., a plurality of first light emitting elements LD1, included in the first sub-pixel SPX1, and a first light conversion pattern LCP1 on the display element layer DPL including the first light emitting elements LD1 may be formed successively from one surface of the substrate SUB.

Similarly, in the second sub-pixel area SPA2 of the substrate SUB, a pixel circuit layer PCL including circuit elements that form the pixel circuit PXC of the second sub-pixel SPX2, a display element layer DPL including a plurality of second light emitting elements LD2 included in the second sub-pixel SPX2, and a second light conversion pattern LCP2 on the display element layer DPL including the second light emitting elements LD2 may be formed successively from the one surface of the substrate SUB. Furthermore, in the third sub-pixel area SPA3 of the substrate SUB, a pixel circuit layer PCL including circuit elements that form the pixel circuit PXC of the third sub-pixel SPX3, a display element layer DPL including a plurality of third light emitting elements LD3 included in the third sub-pixel SPX3, and a third light conversion pattern LCP3 on the display element layer DPL including the third light emitting elements LD3 may be formed successively from the one surface of the substrate SUB.

In this way, the pixel circuit layer PCL, the display element layer DPL, and the light conversion pattern layer LCPL are successively layered on the substrate SUB in the display area DA. For example, the pixel circuit layer PCL may be formed on one surface of the substrate SUB. The display element layer DPL may be formed on the one surface of the substrate SUB on which the pixel circuit layer PCL has been formed. The light conversion pattern layer LCPL may be formed on the one surface of the substrate SUB on which the display element layer DPL has been formed.

In an embodiment, the pixel circuit layer PCL may include a plurality of circuit elements in the display area DA. For example, the pixel circuit layer PCL may include a plurality of circuit elements which are formed in each of the sub-pixel areas SPA to form the pixel circuit PXC of the corresponding sub-pixel SPX. For instance, the pixel circuit layer PCL may include at least one transistor T and a storage capacitor Cst which are in each of the sub-pixel areas SPA.

While FIGS. 7-9 illustrate only a single transistor T (e.g., the first transistor T1 of FIGS. 3A and 3B or the sixth transistor T6 of FIG. 3C) coupled to the light emitting elements LD of each sub-pixel SPX through the corresponding first pixel electrode ELT1, for ease of description the cross-sectional structures of the transistors, e.g., the first to seventh transistors T1 to T7 of FIGS. 3A-3C, which form each pixel circuit PXC may be substantially identical or similar to each other. Furthermore, in the present disclosure, the structure of each transistor T is not limited to that of the embodiments shown in FIGS. 7-9. For example, each transistor T may have various well-known cross-sectional structures. Also, in an embodiment of the present disclosure, some of a plurality of transistors that form each pixel circuit PXC, e.g., some of the first to seventh transistors T1 to T7, may have different types and/or structures, provided that the circuit configuration and applied voltage vary accordingly as those skilled in the art would appreciate.

In addition, the pixel circuit layer PCL may include a plurality of insulating layers. For example, the pixel circuit layer PCL may selectively include first, second, third, and fourth insulating layers INS1, INS2, INS3, and INS4 that are successively stacked on one surface of the substrate SUB. In an embodiment, the first, second, third, and fourth insulating layers INS1, INS2, INS3, and INS4 may be successively stacked between the substrate SUB and the display element layer DPL. The pixel circuit layer PCL may further include at least one buffer layer BFL between the substrate SUB and the circuit elements.

In an embodiment, the buffer layer BFL may prevent impurities from diffusing into each circuit element. The buffer layer BFL may be formed of a single layer, or may be formed of multiple layers, for example, having at least two or more layers. In the case where the buffer layer BFL has a multi-layer structure, the respective layers may be formed of the same material or different materials. In an embodiment, the buffer layer BFL may be omitted.

In an embodiment, each transistor T may include a semiconductor layer SCL, a gate electrode GE, a first electrode ET1, and a second electrode ET2. Although FIGS. 7-9 illustrate embodiments in which each transistor T includes the first electrode ET1 and the second electrode ET2 that are formed separately from the semiconductor layer SCL, the present disclosure is not limited thereto. For example, in an embodiment, in lieu of the structure in which at least one transistor T is in each sub-pixel area SPA separately, the at least one transistor T may have a structure that includes the first and/or second electrode ET1 and/or ET2 integrally formed with the corresponding semiconductor layer SCL.

The semiconductor layer SCL may be on the buffer layer BFL. For example, the semiconductor layer SCL may be between the first insulating layer INS1 and the substrate SUB on which the buffer layer BFL has been formed. The semiconductor layer SCL may include a first region which comes into contact with the first electrode ET1, a second region which comes into contact with the second electrode ET2, and a channel region between the first and second regions. In an embodiment, one of the first and second regions may be a source region, and the other may be a drain region.

In an embodiment, the semiconductor layer SCL may be a semiconductor pattern formed of polysilicon, amorphous silicon, an oxide semiconductor, or other suitable material. The channel region of the semiconductor layer SCL may be an intrinsic semiconductor, which is an undoped semiconductor pattern. Each of the first and second regions of the semiconductor layer SCL may be a semiconductor pattern doped with an impurity (e.g., a predetermined impurity).

The gate electrode GE may be on the semiconductor layer SCL with the first insulating layer INS1 interposed therebetween. For example, the gate electrode GE may be between the first and second insulating layers INS1 and INS2 and overlap at least a portion of the semiconductor layer SCL.

The first and second electrodes ET1 and ET2 may be on the semiconductor layer SCL with at least one insulating layer, e.g., a plurality of insulating layers, interposed between the semiconductor layer SCL and the first and second electrodes ET1 and ET2. For example, the first and second electrodes ET1 and ET2 may be between third and fourth insulating layers INS3 and INS4. The first and second electrodes ET1 and ET2 may be electrically coupled to the semiconductor layer SCL. For example, the first and second electrodes ET1 and ET2 may respectively come into contact with the first region and the second region of the semiconductor layer SCL through corresponding contact holes which pass through the first to third insulating layers INS1 to INS3.

In an embodiment, any one of the first and second electrodes ET1 and ET2 may be electrically coupled to the first pixel electrode ELT1 on the fourth insulating layer INS4 through at least one contact hole, e.g., the first contact hole CH1, passing through the fourth insulating layer INS4. However, this structure may be changed by transistors depending on a connection position, etc. of each transistor T1.

In an embodiment, the storage capacitor Cst may include first and second capacitor electrodes CSE1 and CSE2 located on different layers at positions spaced apart from each other. For example, the first capacitor electrode CSE1 may be between the second and third insulating layers INS2 and INS3. The second capacitor electrode CSE2 may be on at least one conductive layer that forms the transistor T, e.g., on the same layer as that of at least one of the semiconductor layer SCL, the gate electrode GE, and the first and second electrodes ET1 and ET2. For example, the second capacitor electrode CSE2 along with the gate electrode GE of the transistor T may be between the first and second insulating layers INS1 and INS2.

Although for the sake of description in FIGS. 7-9 each of the first and second capacitor electrodes CSE1 and CSE2 has been illustrated as having a single-layer structure, the present disclosure is not limited thereto. For example, at least one of the first and second capacitor electrodes CSE1 and CSE2 may have a multi-layer structure. In other words, for example, the stacked structure, the position, and/or the shape of each of the first and second capacitor electrodes CSE1 and CSE2 may be changed in various suitable ways.

In an embodiment, the display element layer DPL may include a plurality of light emitting elements LD in each sub-pixel area SPA over the pixel circuit layer PCL. For example, the display element layer DPL may include the first light emitting elements LD1 in each first sub-pixel area SPA1, the second light emitting elements LD2 in each second sub-pixel area SPA2, and the third light emitting elements LD3 in each third sub-pixel area SPA3. Furthermore, the display element layer DPL may further include at least one insulating layer and/or insulating pattern around the light emitting elements LD.

For example, the display element layer DPL may include the first and second pixel electrodes ELT1 and ELT2 in each sub-pixel area SPA, the light emitting elements LD between the first and second pixel electrodes ELT1 and ELT2 corresponding to each other, and the first and second contact electrodes CNE1 and CNE2 respectively located on first and second ends EP1 and EP2 of the light emitting elements LD. In addition, the display element layer DPL may further include, e.g., at least one conductive layer and/or at least one insulating layer (or insulating pattern). For example, the display element layer DPL may further include at least one of first and second bank layers BNK1 and BNK2, first, second, and third insulating patterns INP1, INP2, and INP3, and a fifth insulating layer INS5.

In an embodiment, the first and second banks BNK1 and BNK2 may be selectively positioned on the fourth insulating layer INS4 of the pixel circuit layer PCL. For example, the first and second bank layers BNK1 and BNK2 may be on the fourth insulating layer INS4 at positions spaced apart from each other by a predetermined distance.

In an embodiment, each of the first and second bank layers BNK1 and BNK2 may include sn insulating material having an inorganic material or an organic material. Furthermore, each of the first and second banks BNK1 and BNK2 may have a single-layer structure or a multi-layer structure. In other words, the material and/or the stacked structure of each of the first and second bank layers BNK1 and BNK2 may be changed in various suitable ways rather than being particularly limited.

Each of the first and second bank layers BNK1 and BNK2 may have various suitable shapes. For example, as shown in FIG. 7, each of the first and second bank layers BNK1 and BNK2 may have a curved surface having a semi-circular or semi-elliptical cross-section the width of which is gradually reduced upward. Alternatively, as shown in FIG. 8, each of the first and second bank layers BNK1 and BNK2 may have a trapezoidal cross-section the width of which is gradually reduced upward. In other words, the shape of each of the first and second bank layers BNK1 and BNK2 may be changed in various suitable ways rather than being particularly limited.

In an embodiment, the first and second pixel electrodes ELT1 and ELT2 and the first and second connection electrodes CNL1 and CNL2 may be in each sub-pixel area SPA provided with the first and second bank layers BNK1 and BNK2.

In an embodiment, the first and second pixel electrodes ELT1 and ELT2 may be at positions spaced apart from each other by a distance (e.g., a predetermined distance) on the substrate SUB on which the pixel circuit layer PCL and/or the first and second bank layers BNK1 and BNK2 have been formed. The first and second connection electrodes CNL1 and CNL2 may be respectively integrally coupled with the first and second pixel electrodes ELT1 and ELT2.

In an embodiment, the first pixel electrodes ELT1 may be on the respective first bank layers BNK1, and the second pixel electrodes ELT2 may be on the respective second bank layers BNK2. In an embodiment, any one of the first and second pixel electrodes ELT1 and ELT2 may be an anode electrode, and the other may be a cathode electrode.

The first and second pixel electrodes ELT1 and ELT2 may respectively have shapes corresponding to those of the first and second bank layers BNK1 and BNK2. For example, each first pixel electrode ELT1 may have an inclination corresponding to the cross-section of the corresponding first bank layer BNK1, and each second pixel electrode ELT2 may have an inclination corresponding to the cross-section of the corresponding second bank layer BNK2.

In an embodiment, the first and second bank layers BNK1 and BNK2 may not be in each sub-pixel area SPA. For example, as shown in FIG. 9, the first and second bank layers BNK1 and BNK2 may be omitted, and the first and second pixel electrodes ELT1 and ELT2 may be directly positioned on the fourth insulating layer INS4. In this case, each of the first and second pixel electrodes ELT1 and ELT2 may have a substantially planar shape.

In an embodiment, the first and second pixel electrodes ELT1 and ELT2 may be on the same plane and have the same height. As such, if the first and second pixel electrodes ELT1 and ELT2 have the same height, the light emitting elements LD may be more reliably coupled between the first and second pixel electrodes ELT1 and ELT2. However, the present disclosure is not limited to this. For example, the shapes, the structures, and/or the mutual disposition relationship of the first and second pixel electrodes ELT1 and ELT2 may be changed in various suitable ways.

In an embodiment, each of the first and second pixel electrodes ELT1 and ELT2 may include a reflective electrode, but it is not limited thereto. For example, each of the first and second pixel electrodes ELT1 and ELT2 may be formed of a conductive material having a reflectivity (e.g., a predetermined reflectivity). For example, each of the first and second pixel electrodes ELT1 and ELT2 may include at least one of metal such as Ag, Mg, Al, Pt, Pd, Au, Ni, Nd, Ir, Cr, or an alloy thereof, conductive oxide such as indium tin oxide (ITO), indium zinc oxide (IZO), zinc oxide (ZnO), or indium tin zinc oxide (ITZO), and a conductive polymer such as PEDOT; however, it is not limited thereto.

Each of the first and second pixel electrodes ELT1 and ELT2 may have a single-layer structure or a multi-layer structure, and the staked structure thereof is not limited. For example, each of the first and second pixel electrodes ELT1 and ELT2 may have a multi-layer structure including at least one reflective electrode layer and at least one conductive capping layer.

The first and second pixel electrodes ELT1 and ELT2, each having the above-mentioned structure, make it possible for light emitted from the opposite ends, i.e., the first and second ends EP1 and EP2, of each light emitting element LD to propagate in a direction (e.g., in a frontal direction) in which an image is displayed. For example, if each of the first and second pixel electrodes ELT1 and ELT2 has an inclination corresponding to the shape of the corresponding one of the first and second bank layers BNK1 and BNK2, light emitted from the first and second ends EP1 and EP2 of each light emitting element LD may be reflected by the first and second pixel electrodes ELT1 and ELT2, whereby the light may more effectively propagate in the frontal direction. Consequently, the efficiency of light emitted from the light emitting elements LD may be enhanced.

In an embodiment of the present disclosure, each of the first and second bank layers BNK1 and BNK2 may also function as a reflective member. For example, the first and second bank layers BNK1 and BNK2, along with the first and second pixel electrodes ELT1 and ELT2 provided on the first and second bank layers BNK1 and BNK2, may function as reflective members for enhancing the efficiency of light emitted from each light emitting element LD.

In an embodiment, a first insulating pattern INP1 may be on each sub-pixel area SPA provided with the first and second pixel electrodes ELT1 and ELT2, etc. In an embodiment, the first insulating pattern INP1 may be between the pixel circuit layer PCL and the light emitting elements LD. The first insulating pattern INP1 may function to support the light emitting elements LD and prevent the light emitting elements LD from being displaced from correct positions thereof. In an embodiment, the first insulating pattern INP1 may be formed concurrently (e.g., simultaneously) with or independently from any one insulating layer to be formed on the display element layer DPL.

In an embodiment, at least one light emitting element LD, e.g., a plurality of light emitting elements LD, may be provided and aligned on each sub-pixel area SPA provided with the first insulating pattern INP1. For example, a plurality of first light emitting elements LD1 may be provided and aligned on each first sub-pixel area SPA1.

In an embodiment, the light emitting elements LD may be induced to be self-aligned through an electric field formed between the first and second pixel electrodes ELT1 and ELT2. Hence, the light emitting elements LD may be arranged between the first and second pixel electrodes ELT1 and ELT2 of the corresponding sub-pixel area SPA.

The shape and/or the structure of each of the light emitting elements LD is not limited to that shown in FIGS. 7-9. For example, each light emitting element LD may have various suitable well-known shapes, cross-sectional structures and/or connection structures.

In an embodiment, a second insulating pattern INP2 covering portions of respective upper surfaces of the light emitting elements LD may be positioned on each sub-pixel area SPA provided with the light emitting elements LD. In an embodiment, the second insulating pattern INP2 may be formed concurrently (e.g., simultaneously) with or independently from any one insulating layer to be formed on the display element layer DPL.

In an embodiment, the first contact electrode CNE1 may be positioned on each sub-pixel area SPA provided with the second insulating pattern INP2. In an embodiment, each first contact electrode CNE1 may cover the corresponding first pixel electrode ELT1 and be electrically coupled to the first pixel electrode ELT1. Furthermore, each first contact electrode CNE1 may cover the first end EP1 of at least one light emitting element LD on the sub-pixel area SPA and electrically couple the first end EP1 to the corresponding first pixel electrode ELT1.

In an embodiment, a third insulating pattern INP3 may be on each sub-pixel area SPA provided with the first contact electrode CNE1. In an embodiment, each third insulating pattern INP3 may be provided to cover the corresponding first contact electrode CNE1.

In an embodiment, the second contact electrode CNE2 may be on each sub-pixel area SPA provided with the third insulating pattern INP3. In an embodiment, each second contact electrode CNE2 may cover the corresponding second pixel electrode ELT2 and be electrically coupled to the second pixel electrode ELT2. Furthermore, each second contact electrode CNE2 may cover the second end EP2 of at least one light emitting element LD on the sub-pixel area SPA and electrically couple the second end EP2 to the corresponding second pixel electrode ELT2.

In an embodiment, a fifth insulating layer INS5 may be on each sub-pixel area SPA provided with the second contact electrode CNE2. In an embodiment, the fifth insulating layer INS5 may be on the entirety of the display area DA and may cover overall the light emitting elements LD (e.g., the first, second, and third light emitting elements LD1, LD2 and LD3 respectively positioned on the first, second, and third sub-pixel areas SPA1, SPA2, and SPA3), and the electrodes (e.g., the first and second pixel electrodes ELT1 and ELT2, and the first and second contact electrodes CNE1 and CNE2) coupled to the light emitting elements LD.

In an embodiment, the light conversion pattern layer LCPL may be positioned over the display element layer DPL provided with the fifth insulating layer INS5. In an embodiment, the light conversion pattern layer LCPL may include light conversion patterns LCP on the respective sub-pixel areas SPA provided with the fifth insulating layer INS5. For example, the light conversion pattern layer LCPL may include a first light conversion pattern LCP1 on each of the first sub-pixel areas SPA1 provided with the fifth insulating layer INS5. Similarly, the light conversion pattern layer LCPL may include a second light conversion pattern LCP2 on each of the second sub-pixel areas SPA2 provided with the fifth insulating layer INS5. In addition, the light conversion pattern layer LCPL may selectively include a third light conversion pattern LCP3 on each of the third sub-pixel areas SPA3 provided with the fifth insulating layer INS5.

In an embodiment, each light conversion pattern LCP may include at least one color conversion layer or at least one light scattering layer, at least one capping layer, and/or at least one color filter. For example, each first light conversion pattern LCP1 may include a first color conversion layer CCL1, a first capping layer CPL1, and a first color filter CF1.

In an embodiment, each color conversion layer may include at least one kind of light conversion particles. For example, if the first sub-pixel SPX1 is a red sub-pixel and the first light emitting elements LD1 provided in the first sub-pixel SPX1 are light emitting elements for emitting light of colors other than red, the first color conversion layer CCL1 may include red quantum dots QDr. Furthermore, in this case, the first color filter CF1 may be a red color filter.

In the foregoing embodiments, the light conversion pattern layer LCPL is directly formed and/or positioned on one surface of the substrate SUB provided with the display element layer DPL, etc., whereby the optical efficiency of the light emitting display device may be enhanced, and the light emitting display device may express vivid colors. Furthermore, the process of fabricating the light emitting display device may be facilitated, and the production cost may be reduced. More detailed description of the light conversion pattern layer LCPL will be made later herein.

FIGS. 10-16 are sectional views each illustrating the structure of the pixel PXL in accordance with an embodiment of the present disclosure. For example, FIGS. 10-16 are sectional views taken along the line II-II' of FIG. 6 in accordance with different embodiments. In an embodiment, the cross-sectional structures of the pixels PXL in the display area DA may be substantially identical or similar to each other. Therefore, with reference to FIGS. 10-16 illustrating the cross-section of any one pixel PXL, the structure of each pixel PXL will be comprehensively described. In FIG. 10-FIG. 16, the same reference numerals are used to designate components similar or equal to those of FIGS. 1-9, and detailed descriptions thereof will be omitted.

Figure 11:
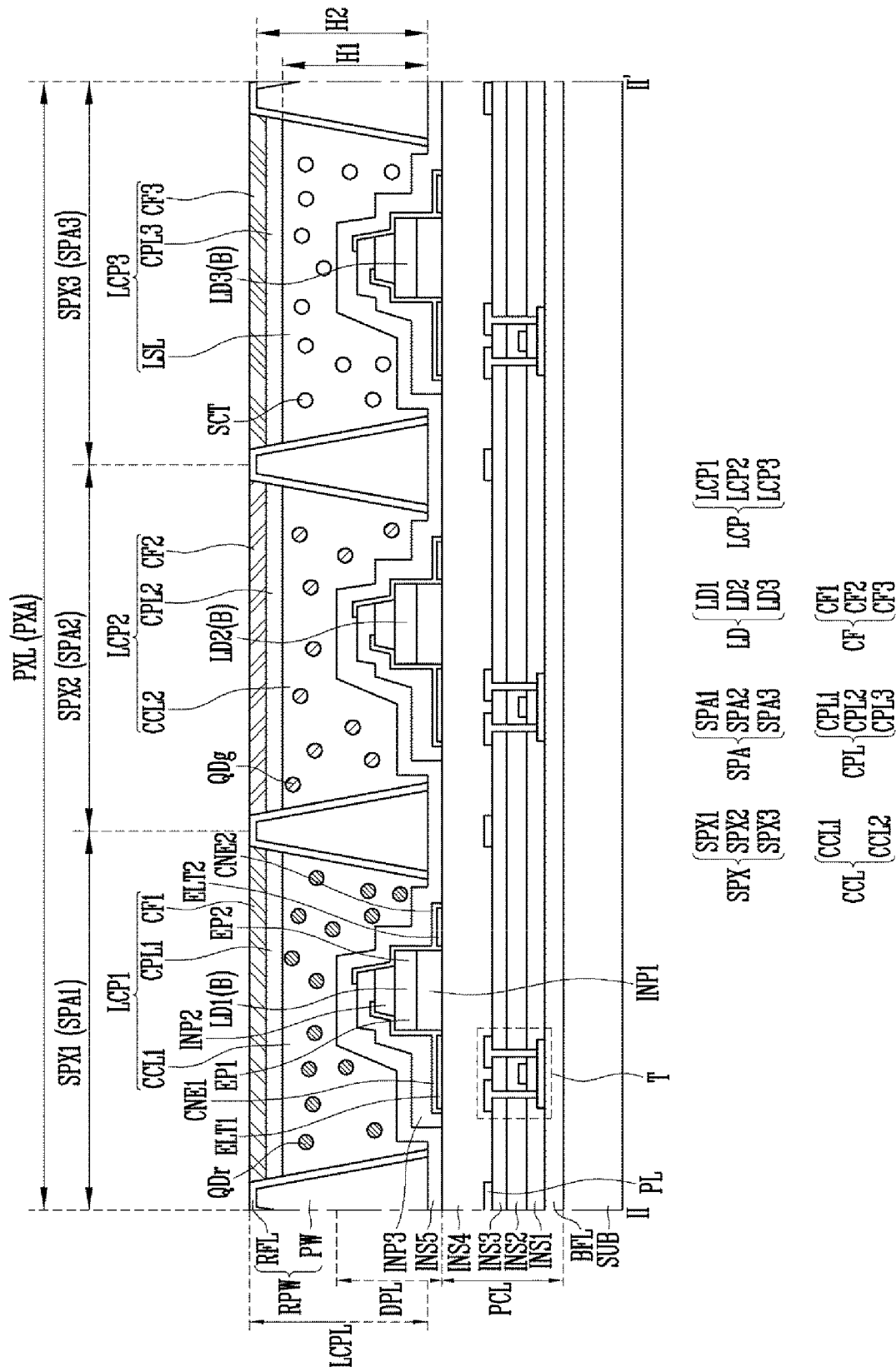

Referring to FIGS. 10 and 11 along with FIGS. 1-9, the pixel circuit layer PCL, the display element layer DPL, and the light conversion pattern layer LCPL may be successively formed on one surface of the substrate SUB. For example, the pixel circuit layer PCL may be selectively provided. For example, an active light emitting display panel 100 may include the pixel circuit layer PCL.

In an embodiment, the pixel circuit layer PCL may include at least one circuit element which forms the pixel circuit PXC of each sub-pixel SPX. For example, the pixel circuit layer PCL may include at least one transistor T.

In an embodiment, for example, at least one power line PL and/or a signal line may be further on the pixel circuit layer PCL. For instance, a power line PL for supplying the second power supply VSS may be on the pixel circuit layer PCL. In an embodiment, the power line PL may have a single-layer structure or a multi-layer structure, and may include at least one conductive layer on the same layer as that of one electrode of a circuit element included on the pixel circuit layer PCL.

In some embodiments, the light emitting display device in accordance with the present disclosure may not include the pixel circuit layer PCL. For example, the light emitting display device in accordance with an embodiment may be a passive light emitting display device including a passive light emitting display panel. In this case, the light emitting display device may not include the pixel circuit layer PCL, or may selectively include only at least one buffer layer BFL and/or at least one insulating layer. For example, the display element layer DPL may be directly formed on the substrate SUB and/or the buffer layer BFL.

The display element layer DPL may be on one surface of the substrate SUB on which the pixel circuit layer PCL has been formed. The display element layer DPL may include a plurality of light emitting elements LD in each pixel area PXA.

For example, the display element layer DPL may include at least one first light emitting element LD1 in each first sub-pixel area SPA1, at least one second light emitting element LD2 in each second sub-pixel area SPA2, and at least one third light emitting element LD3 in each third sub-pixel area SPA3. In detail, the first sub-pixel SPX1 may include the first light emitting element LD1 in the first sub-pixel area SPA1 of the display element layer DPL, and may selectively include the pixel circuit PXC coupled to the first light emitting element LD1. Similarly, the second sub-pixel SPX2 may include the second light emitting element LD2 in the second sub-pixel area SPA2 of the display element layer DPL, and may selectively include the pixel circuit PXC coupled to the second light emitting element LD2. In addition, the third sub-pixel SPX3 may include the third light emitting element LD3 in the third sub-pixel area SPA3 of the display element layer DPL, and may selectively include the pixel circuit PXC coupled to the third light emitting element LD3. Furthermore, the display element layer DPL may include at least one insulating layer, e.g., the fifth insulating layer INS5, which covers the light emitting elements LD.

The light conversion pattern layer LCPL may be on the one surface of the substrate SUB on which the display element layer DPL is located. The light conversion pattern layer LCPL may include a partition wall PW and light conversion patterns LCP which are positioned over the fifth insulating layer INS5.

In an embodiment, the partition wall PW may be between the first, second, and third sub-pixels SPX1, SPX2, and SPX3. For example, the partition wall PW may be at a boundary region between the first, second, and third sub-pixels SPX1, SPX2, and SPX3.

Depending on embodiments, the partition wall PW may have various suitable shapes. For example, the partition wall PW may have a shape capable of satisfying a viewing angle of a predetermined value or more. For instance, as shown in FIG. 10, the partition wall PW may have a curved cross-section such as a semi-circular or semi-elliptical cross-section, the width of which is gradually reduced upward from the display element layer DPL. Alternatively, as shown in FIG. 11, the partition wall PW may have a trapezoidal cross-section the width of which is reduced in a direction away from the display element layer DPL. As a further alternative, in an embodiment, the partition wall PW may have other cross-sectional shapes, e.g., a triangular shape. In other words, in the present disclosure, e.g., the shape and/or the inclination of the partition wall PW is not particularly limited, and it may be changed in various suitable ways.

In an embodiment, the partition wall PW may have a height greater than that of a color conversion layer CCL and/or a light scattering layer LSL. For example, the partition wall PW may have a height H2 greater than a height H1 of each of the first and second color conversion layers CCL1 and CCL2 and the light scattering layer LSL. In this case, in an operation of forming each of the color conversion layer CCL and/or the light scattering layer LSL, the partition wall PW may be used as a dam structure so that at least one color conversion layer CCL and/or at least one light scattering layer LSL may be easily formed by an inkjet printing method or the like.

Furthermore, a reflective layer RFL may be selectively located on the surface of the partition wall PW. For example, the reflective layer RFL may cover the entirety of the surface of the partition wall PW that is exposed upward out of the display element layer DPL. In this case, a reflective partition wall RPW may be between the first, second, and third sub-pixels SPX1, SPX2, and SPX3, thus preventing light from leaking between adjacent sub-pixels SPX. For example, due to the reflective partition wall RPW, light may be prevented from leaking out of each sub-pixel SPX in a lateral direction. In this case, even when a separate black matrix is not provided, color mixture may be prevented from occurring between adjacent sub-pixels SPX. Furthermore, due to the reflective partition wall RPW, light generated from the interior of each sub-pixel SPX may be efficiently emitted. Consequently, the optical efficiency of the sub-pixels SPX may be enhanced.

The material of the reflective layer RFL is not limited to a particular material. For example, the reflective layer RFL may be formed of various well-known suitable reflective materials.

In an embodiment, the light conversion patterns LCP may include first, second, and third light conversion patterns LCP1, LCP2, and LCP3 that are respectively located in the first, second, and third sub-pixel areas SPA1, SPA2, and SPA3. In an embodiment, each of the first, second, and third light conversion patterns LCP1, LCP2, and LCP3 may include a color conversion layer CCL or a light scattering layer LSL, a capping layer CPL, and/or a color filter CF.

In an embodiment of the present disclosure, the first, second, and third sub-pixels SPX1, SPX2, and SPX3 may be sub-pixels that emit light of different colors. For example, the first, second, and third sub-pixels SPX1, SPX2, and SPX3 may be respectively red, green, and blue sub-pixels, which respectively emit red, green, and blue light. The first, second, and third light emitting elements LD1, LD2, and LD3 may emit light of the same color. For example, all of the first, second, and third light emitting elements LD1, LD2, and LD3 may be formed of blue light emitting diodes, which emit blue light.

In this case, at least one of the first, second, and third light conversion patterns LCP1, LCP2, and LCP3 may include a color conversion layer CCL. For example, each first light conversion pattern LCP1 may include a first color conversion layer CCL1 and a first color filter CF1, and may selectively include a first capping layer CPL1 between the first color conversion layer CCL1 and the first color filter CF1. Similarly, each second light conversion pattern LCP2 may include a second color conversion layer CCL2 and a second color filter CF2, and may selectively include a second capping layer CPL2 between the second color conversion layer CCL2 and the second color filter CF2. In some embodiments, each third light conversion pattern LCP3 may not include the color conversion layer. For example, each third light conversion pattern LCP3 may include a light scattering layer LSL and a third color filter CF3, and may, in some embodiments, selectively include a third capping layer CPL3 between the light scattering layer LSL and the third color filter CF3.

In an embodiment, the first color conversion layer CCL1 may be located on the fifth insulating layer INS5 in each first sub-pixel area SPA1 and enclosed by the partition wall PW. The first color conversion layer CCL1 may include light conversion particles (e.g., fluorescent particles including quantum dots) for converting light having a specific wavelength and/or color emitted from the first light emitting element LD1 into light having other wavelengths and/or colors.

For example, in the case where the first light emitting element LD1 is a blue light emitting element and the first sub-pixel SPX1 is a red sub-pixel, the first color conversion layer CCL1 may include red quantum dots QDr, which absorb blue light, shift the wavelength thereof by energy transition, and thus emit red light having a wavelength ranging from 620 nm to 780 nm. For example, the first color conversion layer CCL1 may include a plurality of red quantum dots QDr that are distributed in a matrix material (e.g., a predetermined matrix material) such as transparent resin. In the case where the first sub-pixel SPX1 is one of sub-pixels of other colors, the first color conversion layer CCL1 may include first quantum dots having a color corresponding to that of the first sub-pixel SPX1.

In an embodiment, the first color filter CF1 may be formed over the first color conversion layer CCL1. For example, in the case where the first sub-pixel SPX1 is a red sub-pixel, the first color filter CF1 may be a red color filter.

In an embodiment, the first capping layer CPL1 may be between the first color conversion layer CCL1 and the first color filter CF1. For example, the first capping layer CPL1 may be formed over the first color conversion layer CCL1 to cover the first color conversion layer CCL1, and may be formed of a transparent material to minimize (or reduce) a loss of light emitted from the first light emitting element LD1. The first capping layer CPL1 may prevent the first color conversion layer CCL1 from being damaged, e.g., during the process of fabricating the light emitting display device, and may reinforce adhesive strength between the first color conversion layer CCL1 and the first color filter CF1. In an embodiment, the first capping layer CPL1 may be omitted.

In an embodiment, the first capping layer CPL1 may be individually formed in each sub-pixel area SPA, or may be integrally formed in the entirety of the display area DA. In other words, the first, second, and third capping layers CPL1, CPL2, and CPL3 may be formed of individual patterns separated from each other, or may be formed of an integrated pattern.

In an embodiment, the second color conversion layer CCL2 may be formed on the fifth insulating layer INS5 in each second sub-pixel area SPA2 and enclosed by (or surrounded by) the partition wall PW. The second color conversion layer CCL2 may include light conversion particles for converting light having a specific wavelength and/or color emitted from the second light emitting element LD2 into light having other wavelengths and/or colors.

For example, in the case where the second light emitting element LD2 is a blue light emitting element and the second sub-pixel SPX2 is a green sub-pixel, the second color conversion layer CCL2 may include green quantum dots QDg, which absorb blue light, shift the wavelength thereof by energy transition, and thus emit green light having a wavelength ranging from 500 nm to 570 nm. For example, the second color conversion layer CCL2 may include a plurality of green quantum dots QDg which are distributed in a matrix material (e.g., a predetermined matrix material) such as a transparent resin. In the case where the second sub-pixel SPX2 is one of sub-pixels of other colors, the second color conversion layer CCL2 may include second quantum dots having a color corresponding to that of the second sub-pixel SPX2.

Each of the first and second quantum dots (or red and green quantum dots QDr and QDg) may be selected from among a group II-IV compound, a group IV-VI compound, a group IV element, a group IV compound, and a combination thereof.

The group II-VI compound may be selected from the group consisting of: a binary compound selected from the group consisting of CdSe, CdTe, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quanternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from the group consisting of: a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a quanternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from the group consisting of: a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quanternary compound selected from the group consisting of SnPbSSe, SnPbSeTe, SnPbSTe, and a mixture thereof. The group IV element may be selected from the group consisting of Si, Ge, and a mixture thereof. The group IV compound may be a binary compound selected from the group consisting of SiC, SiGe, and a mixture thereof.

The first and second quantum dots may have a full width of half maximum (FWHM) of an emission wavelength spectrum of about 45 nm or less, and light emitted through the first and second quantum dots may be emitted in all directions. Consequently, the viewing angle of the light emitting display device may be enhanced.

Each of the first and second quantum dots may be in the form of a nanoparticle, a nanotube, a nanowire, nanofiber, a planar nanoparticle having a spherical shape, a pyramid shape, a multi-arm shape, or a cubic shape, but it is not limited thereto. In other words, the shapes of the first and second quantum dots may be changed in various suitable ways.

In an embodiment of the present disclosure, blue light having a comparatively short wavelength in a visible ray area is incident on each of the red and green quantum dots QDr and QDg, so that the absorption coefficient of the red and green quantum dots QDr and QDg may be increased. Thereby, eventually, the efficiency of light emitted from the first and second sub-pixels SPX1 and SPX2 may be enhanced, and satisfactory color reproducibility may be secured. Furthermore, the first, second, and third light emitting elements LD1, LD2, and LD3 respectively in the first, second, and third sub-pixel areas SPA1, SPA2, and SPA3 may have the same color (e.g., blue). Hence, the production efficiency of the light emitting display device may be enhanced.

In an embodiment, the second color filter CF2 may be formed over each second color conversion layer CCL2. For example, in the case where the second sub-pixel SPX2 is a green sub-pixel, the second color filter CF2 may be a green color filter.

In an embodiment, the second capping layer CPL2 may be between the second color conversion layer CCL2 and the second color filter CF2. For example, the second capping layer CPL2 may be formed over the second color conversion layer CCL2 to cover the second color conversion layer CCL2, and may be formed of a transparent material to reduce or minimize loss of light emitted from the second light emitting element LD2. The second capping layer CPL2 may prevent the second color conversion layer CCL2 from being damaged, e.g., during the process of fabricating the light emitting display device, and may reinforce adhesive strength between the second color conversion layer CCL2 and the second color filter CF2. In an embodiment, the second capping layer CPL2 may be omitted.

In an embodiment, the light scattering layer LSL may be selectively layered on the fifth insulating layer INS5 in each third sub-pixel area SPA3 and enclosed by (or surrounded by) the partition wall PW. In an embodiment, when the third light emitting element LD3 is a blue light emitting element and the third sub-pixel SPX3 is a blue sub-pixel, the light scattering layer LSL may be selectively provided to efficiently use light emitted from the third light emitting element LD3. The light scattering layer LSL may include at least one kind of scattering particles SCT. For example, the light scattering layer LSL may include scattering particles SCT such as $TiO_2$ or silica. For example, the light scattering layer LSL may include a plurality of scattering particles SCT that are distributed in a matrix material (e.g., a predetermined matrix material) such as transparent resin. In the present disclosure, the material of the scattering particles SCT is not particularly limited, and the light scattering layer LSL may be formed of various suitable well-known materials.

Here, the scattering particles SCT may be in areas other than the third sub-pixel area SPA3. For example, the scattering particles SCT may be selectively included in the first and/or second color conversion layer CCL1 and/or CCL2.

In an embodiment, the third color filter CF3 may be selectively formed over each light scattering layer LSL. For example, in the case where the third sub-pixel SPX3 is a blue sub-pixel, the third color filter CF3 may be a blue color filter.

In an embodiment, a third capping layer CPL3 may be selectively formed between the light scattering layer LSL and the third color filter CF3. For example, the third capping layer CPL3 may be formed over the light scattering layer LSL to cover the light scattering layer LSL, and may be formed of a transparent material to minimize or reduce loss of light emitted from the third light emitting element LD3. The third capping layer CPL3 may prevent the light scattering layer LSL from being damaged, e.g., during the process of fabricating the light emitting display device, and may reinforce adhesive strength between the light scattering layer LSL and the third color filter CF3. In an embodiment, the third capping layer CPL3 may be omitted.

In an embodiment, although not shown, an overcoating layer, an encapsulation layer, or the like may be selectively formed over the substrate SUB provided with the light conversion pattern layer LCPL. In this case, the display area DA may be effectively sealed and protected even without using a separate upper substrate (or encapsulation substrate).

Figure 12:
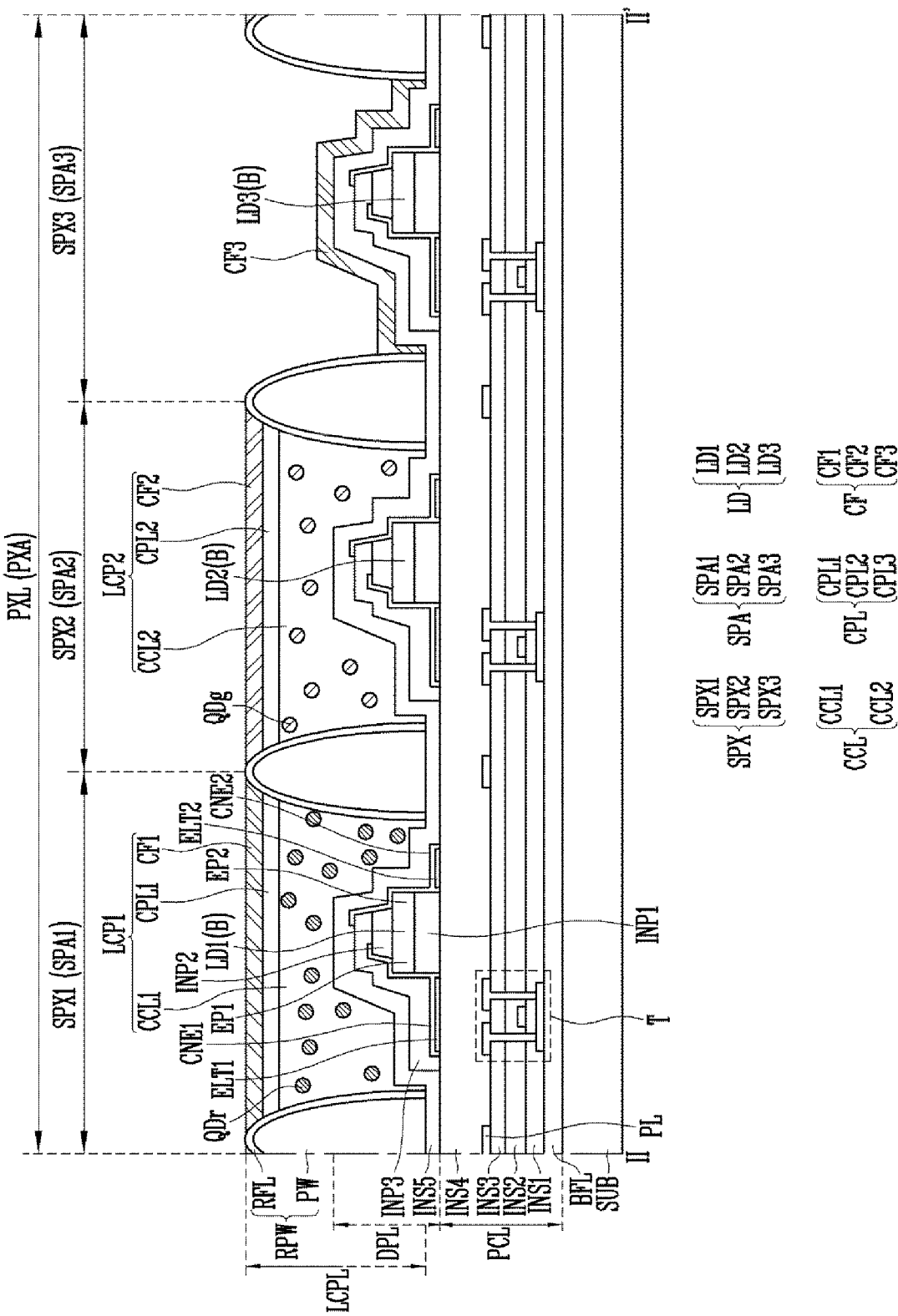

Referring to FIG. 12, each third sub-pixel area SPA3 may not include the light scattering layer LSL. For example, if the emission performance (e.g., the luminance, the quantity of light, and/or the optical efficiency) of the third light emitting elements LD in the third sub-pixel area SPA3 is sufficient to satisfy conditions of a predetermined range, the light scattering layer LSL may be omitted. In this case, the third color filter CF3 may be directly on the fifth insulating layer INS5 in each third sub-pixel area SPA3.

Figure 13:
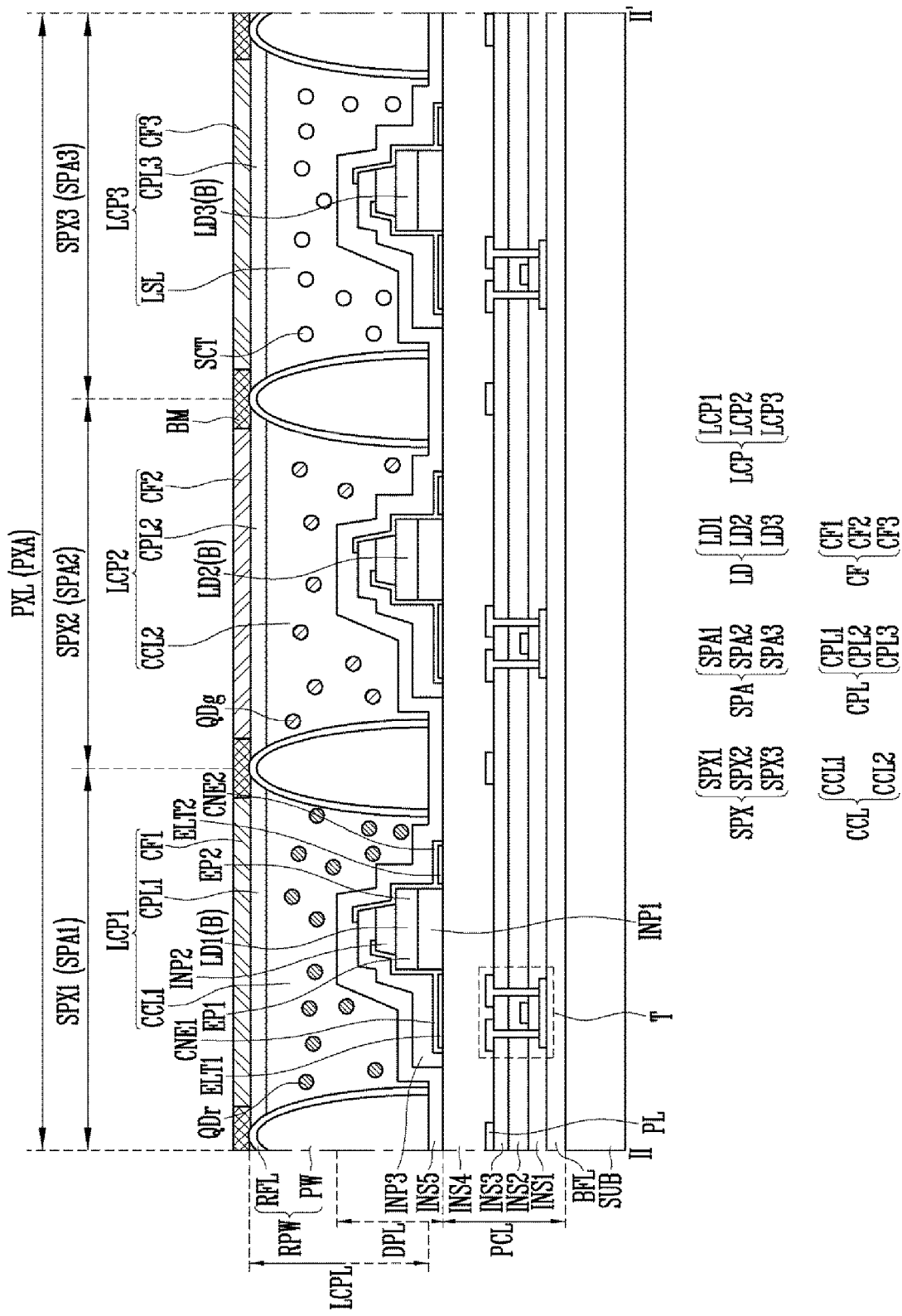
Figure 14:
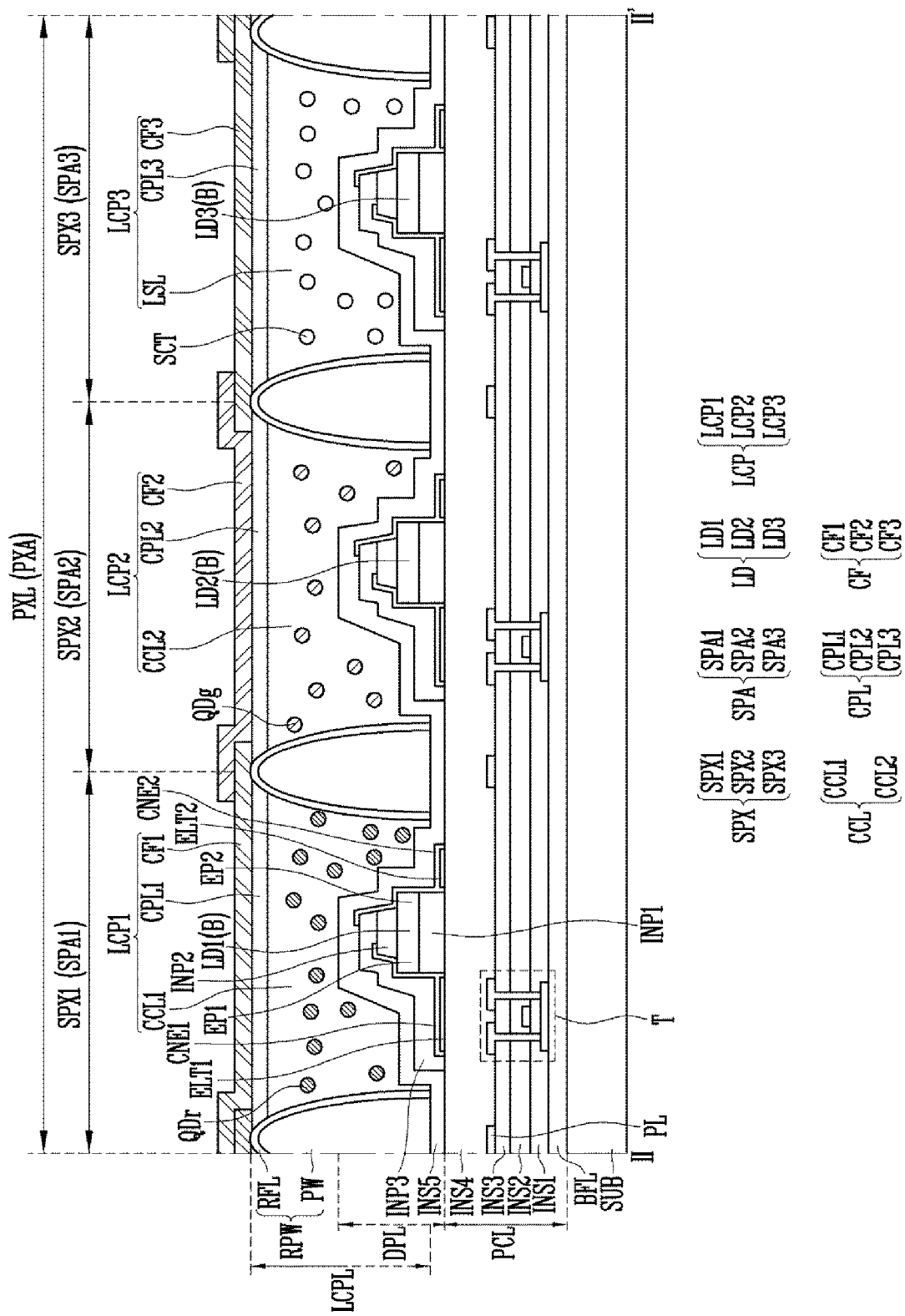

Referring to FIGS. 13 and 14, each color filter CF may be at a position higher than that of the reflective partition wall RFW. In this case, as shown in FIG. 13, a separate black matrix BM may be on the reflective partition wall RFW between adjacent sub-pixels SPX, thus preventing light from leaking. Alternatively, as shown in FIG. 14, adjacent color filters CF may partially overlap each other so as to substitute for the black matrix BM, thus preventing light from leaking.

Figure 15:
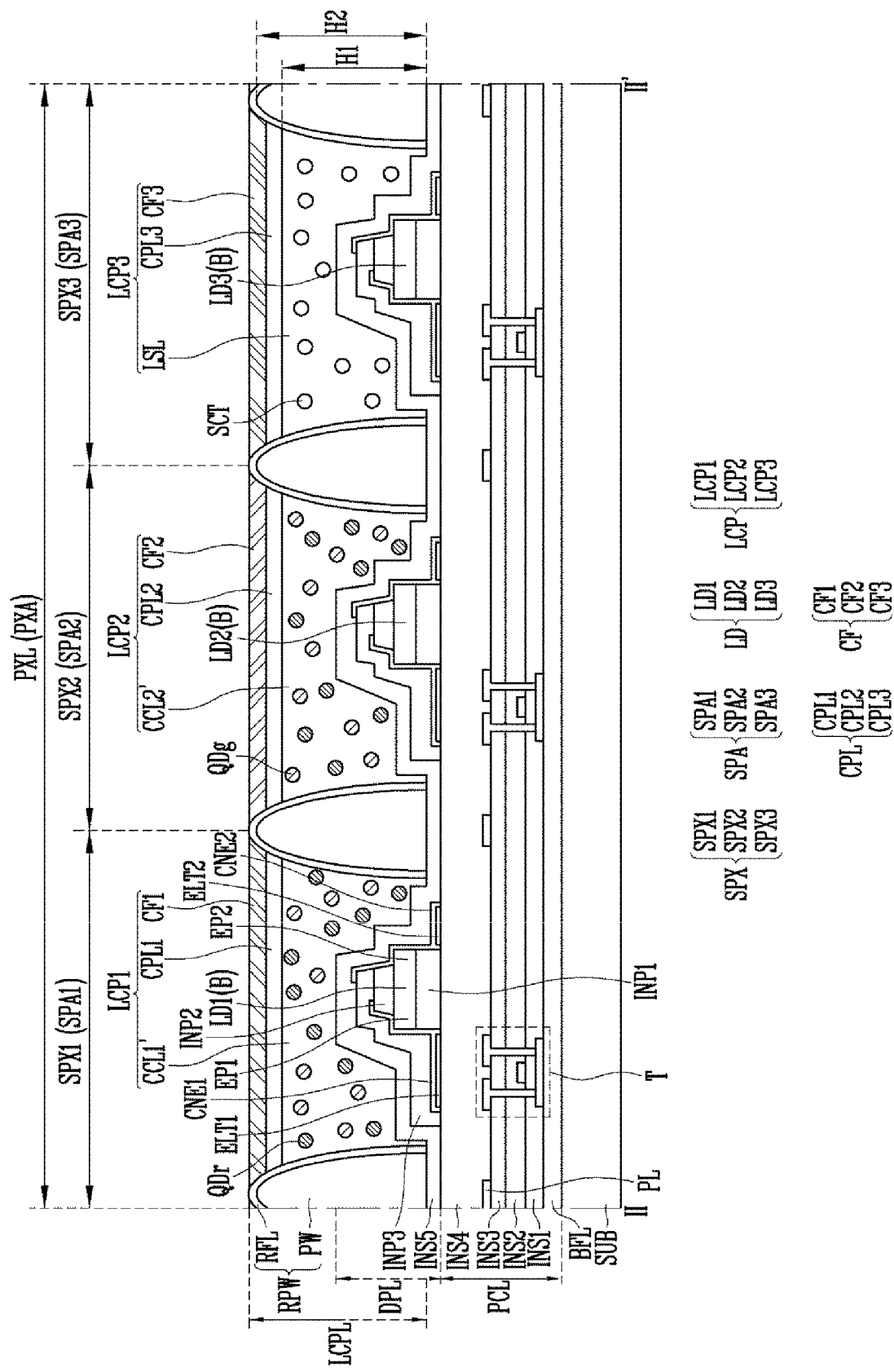

Referring to FIG. 15, first and second color conversion layers CCL1' and CCL2' may have substantially the same configuration as each other. For example, if all of the first, second, and third light emitting elements LD1, LD2, and LD3 emit blue light and the first and second sub-pixels SPX1 and SPX2 are respectively a red sub-pixel and a green sub-pixel, each of the first and second color conversion layers CCL1' and CCL2' may include a combination of red and green quantum dots QDr and QDg, and the first and second color filters CF1 and CF2 may be respectively a red color filter and a green color filter.

In this case, the first and second color conversion layers CCL1' and CCL2' may be concurrently (e.g., simultaneously) formed through the same process, whereby the process of fabricating the light emitting display device may be further facilitated.

Figure 16:
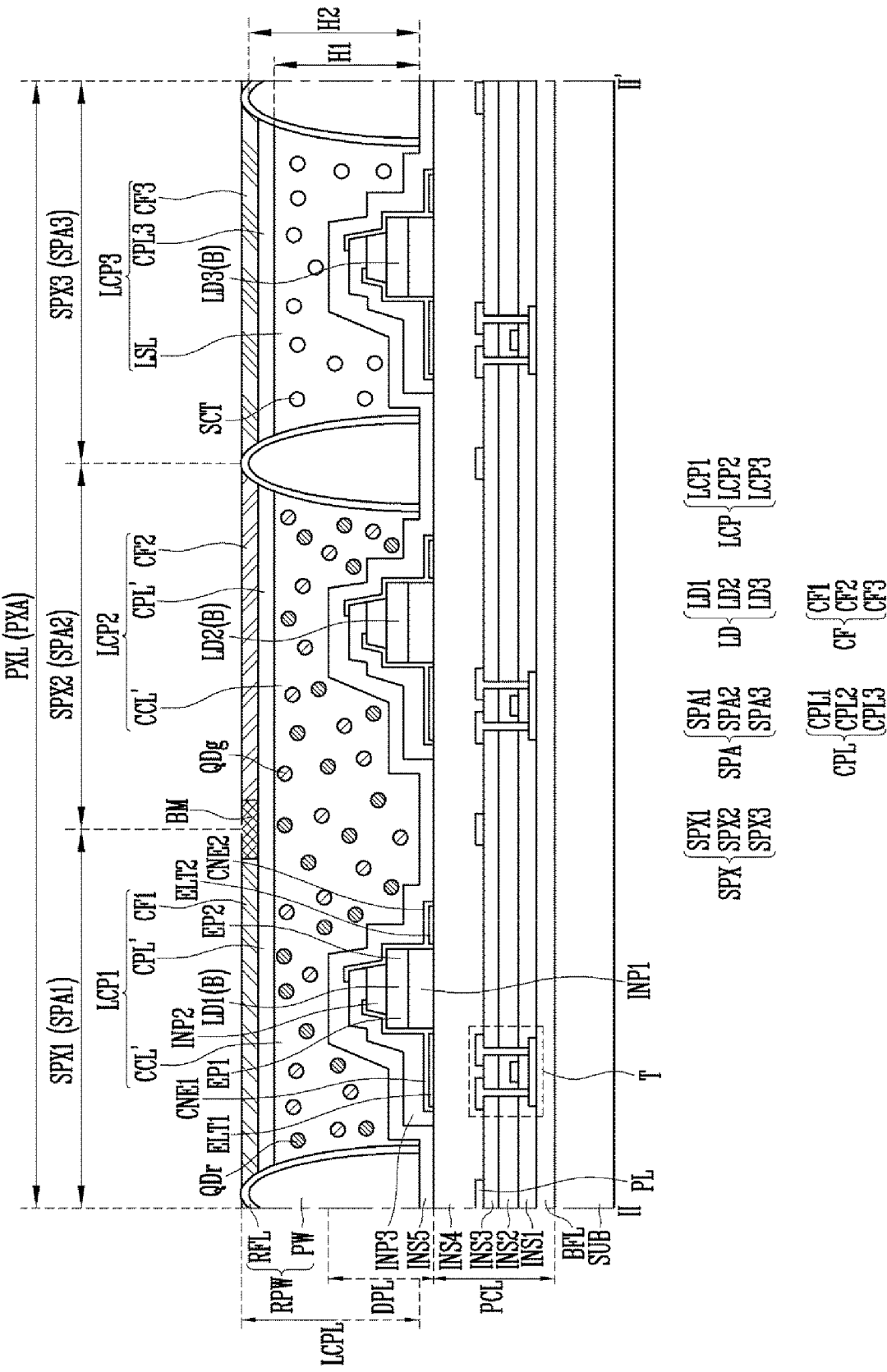

Referring to FIG. 16, a pair of adjacent first and second color conversion layers CCL1 and CCL2 may be integrated with each other into a single color conversion layer CCL'. For example, in each pixel PXL, the integrated color conversion layer CCL' may be formed in the first and second sub-pixel areas SPA1 and SPA2 without including the partition wall PW formed between the first and second sub-pixels SPX1 and SPX2.

In this case, in the first sub-pixel area SPA1, the first color filter CF1, e.g., a red first color filter CF1, may be formed over the color conversion layer CCL'. In the second sub-pixel area SPA2, the second color filter CF2, e.g., a green second color filter CF2, may be formed over the color conversion layer CCL'. Furthermore, a black matrix BM may be between the first and second color filters CF1 and CF2. Thereby, the first and second sub-pixels SPX1 and SPX2 may respectively form a red sub-pixel and a green sub-pixel. In addition, an integrated capping layer CPL' may be selectively formed in the pair of first and second sub-pixel areas SPA1 and SPA2.

In the above-mentioned embodiments, the light conversion pattern layer LCPL may be directly formed on the substrate SUB on which the light emitting elements LD are located. Therefore, the distance between the light conversion pattern layer LCPL and the light emitting elements LD may be reduced, so that a light leakage phenomenon may be mitigated or prevented. Furthermore, the upper substrate, etc., of the light emitting display device may be selectively omitted. If the upper substrate is omitted, a process of joining upper and lower substrates with each other may not be needed. Hence, the process of fabricating the light emitting display device may be facilitated, the production cost may be reduced, and the optical efficiency may be enhanced.

In addition, since the optical conversion pattern layer LCPL is directly formed on the substrate SUB, a process error may be reduced compared to that of the case where the process of joining the upper and lower substrates with each other is required. Thereby, dead space between the sub-pixels SPX may be reduced, and the sub-pixels SPX may be close to each other.

Furthermore, the partition wall PW formed between the sub-pixels SPX may have a height greater than at least the height H1 of the color conversion layer CCL or CCL' and/or the light scattering layer LSL. Therefore, the process of forming the color conversion layer CCL or CCL' and/or the light scattering layer LSL may be simplified and/or facilitated. Furthermore, a light leakage phenomenon which may be caused between the sub-pixels SPX may be mitigated or prevented.

In the case where the reflective partition wall RFW is formed by forming the reflective layer RFL on the surface of the partition wall PW, leakage of light in lateral or diagonal directions of the sub-pixels SPX may be mitigated or prevented, and the optical efficiency of the sub-pixels SPX may be further enhanced. Furthermore, in this case, the width of the black matrix BM may be reduced, or the black matrix BM may be selectively omitted. Thereby, the aperture ratio of the light emitting display device may be enhanced, the fabricating process may be further simplified, and the production cost may be reduced.

Consequently, various embodiments of the present disclosure may provide a light emitting display device capable of enhancing optical efficiency and expressing vivid colors. Furthermore, in various embodiments, the process of fabricating the light emitting display device may be facilitated, and the production cost may be reduced.

FIGS. 17A-17E are sectional views sequentially illustrating a method of fabricating the light emitting display device in accordance with an embodiment of the present disclosure, for example, sequentially illustrating operations of fabricating the pixel PXL shown in FIG. 10. In the following description with reference to FIGS. 17A-17E, further detailed descriptions of the respective components described in the above-mentioned embodiments will be omitted.

Referring to FIG. 17A, the substrate SUB including the first, second, and third sub-pixel areas SPA1, SPA2, and SPA3 is prepared. In an embodiment, the pixel circuit layer PCL may be selectively formed on one surface of the substrate SUB.

Figure 17B:
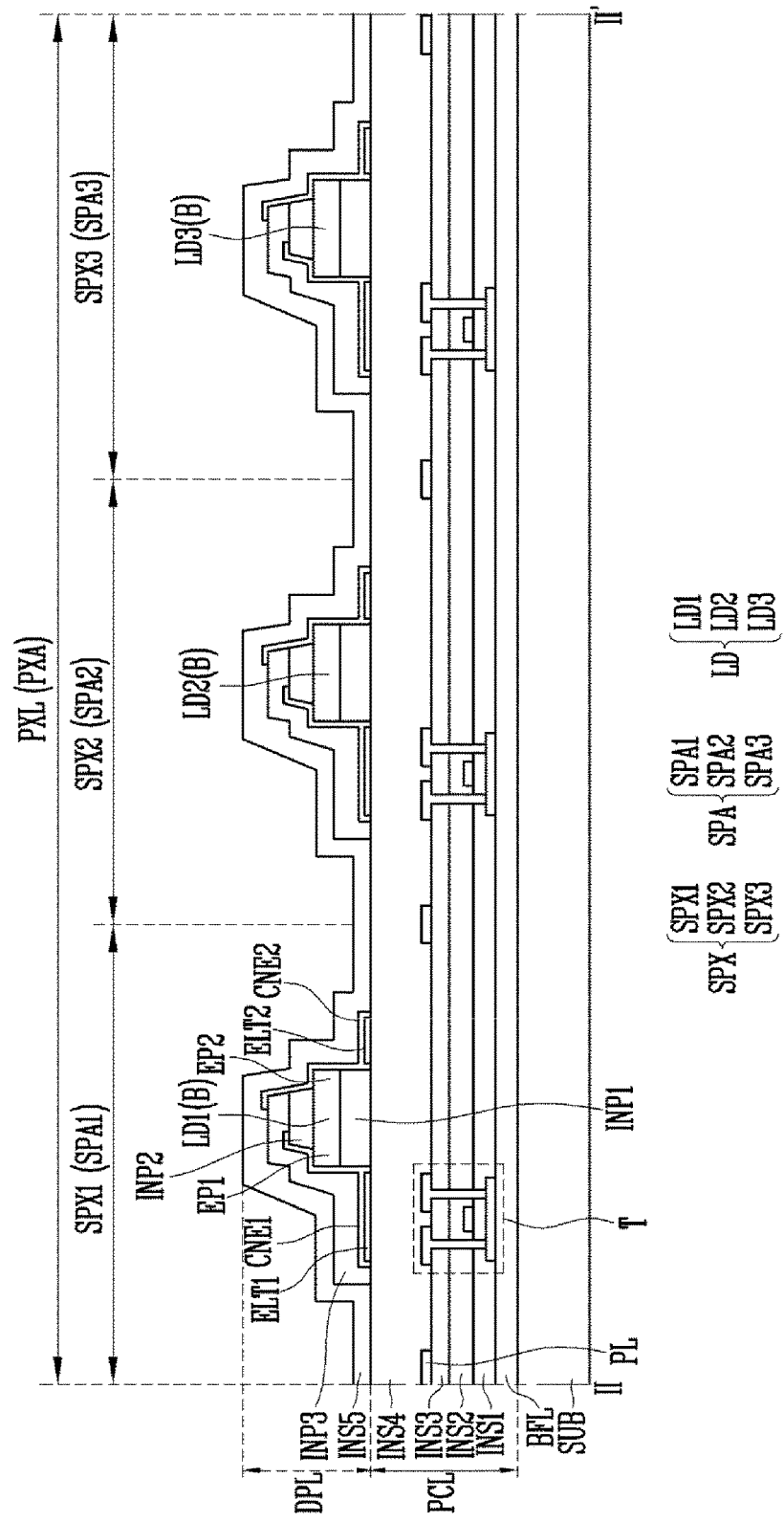

Referring to FIG. 17B, the display element layer DPL is formed on one surface of the prepared substrate SUB, e.g., on the one surface of the substrate SUB on which pixel circuit layer PCL has been formed. In an embodiment, the operation of forming the display element layer DPL may include an operation of disposing (e.g., supplying and aligning) the first, second, and third light emitting elements LD1, LD2, and LD3 in the first, second, and third sub-pixel areas SPA1, SPA2, and SPA3, respectively, and an operation of forming at least one insulating layer, e.g., the fifth insulating layer INS5, on the one surface of the substrate SUB on which the first, second, and third light emitting elements LD1, LD2, and LD3 have been formed.

Figure 17C:
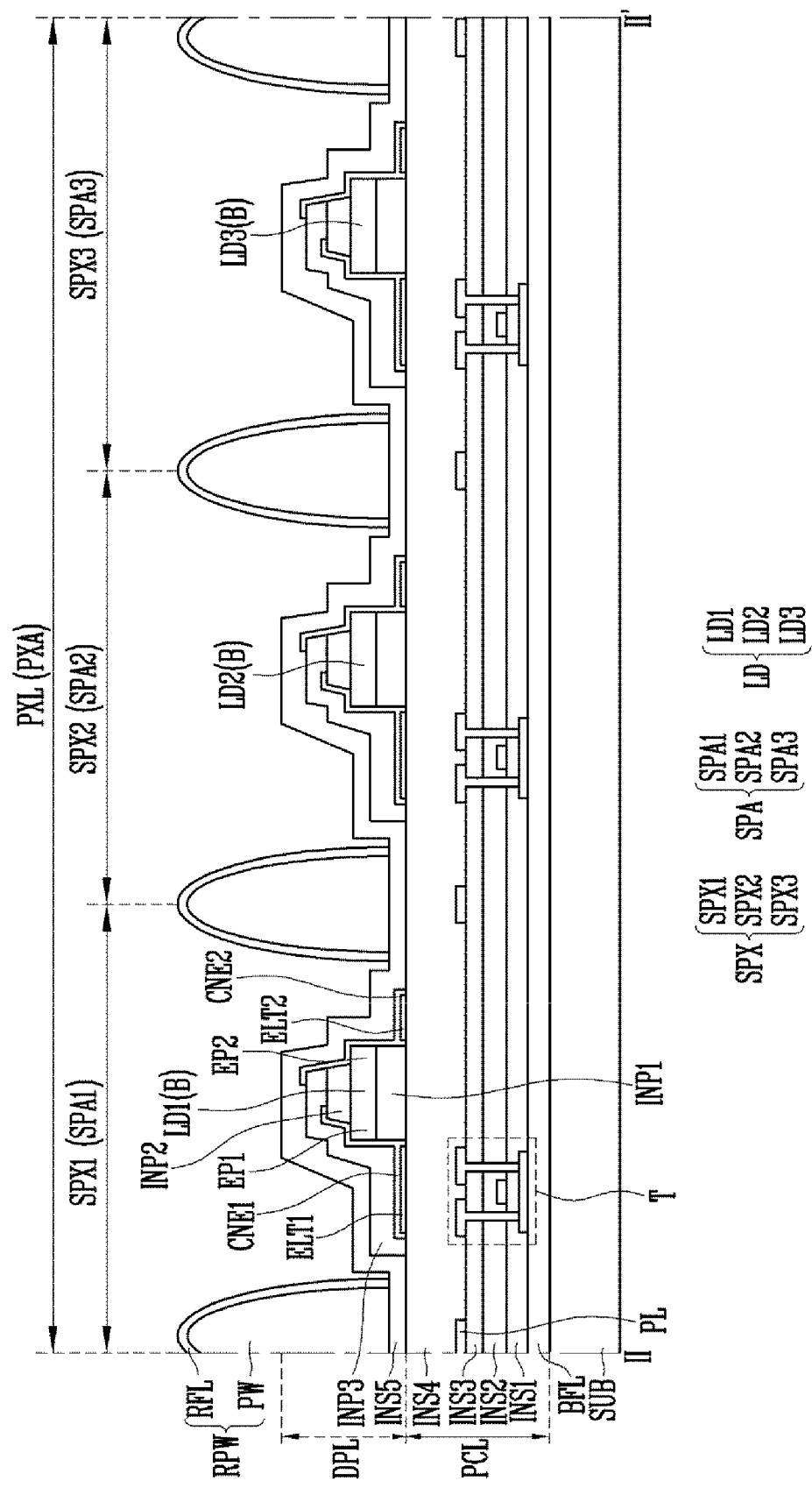

Referring to FIG. 17C, the partition wall PW is formed on the one surface of the substrate SUB on which the display element layer DPL has been formed. For example, integrated or separate partition walls PW may be formed between the first, second, and third sub-pixel areas SPA1, SPA2, and SPA3 on the fifth insulating layer INS5. In an embodiment, the reflective partition wall PW may be formed by forming an additional reflective layer RFL on the surface of the partition wall PW.

Figure 17D:
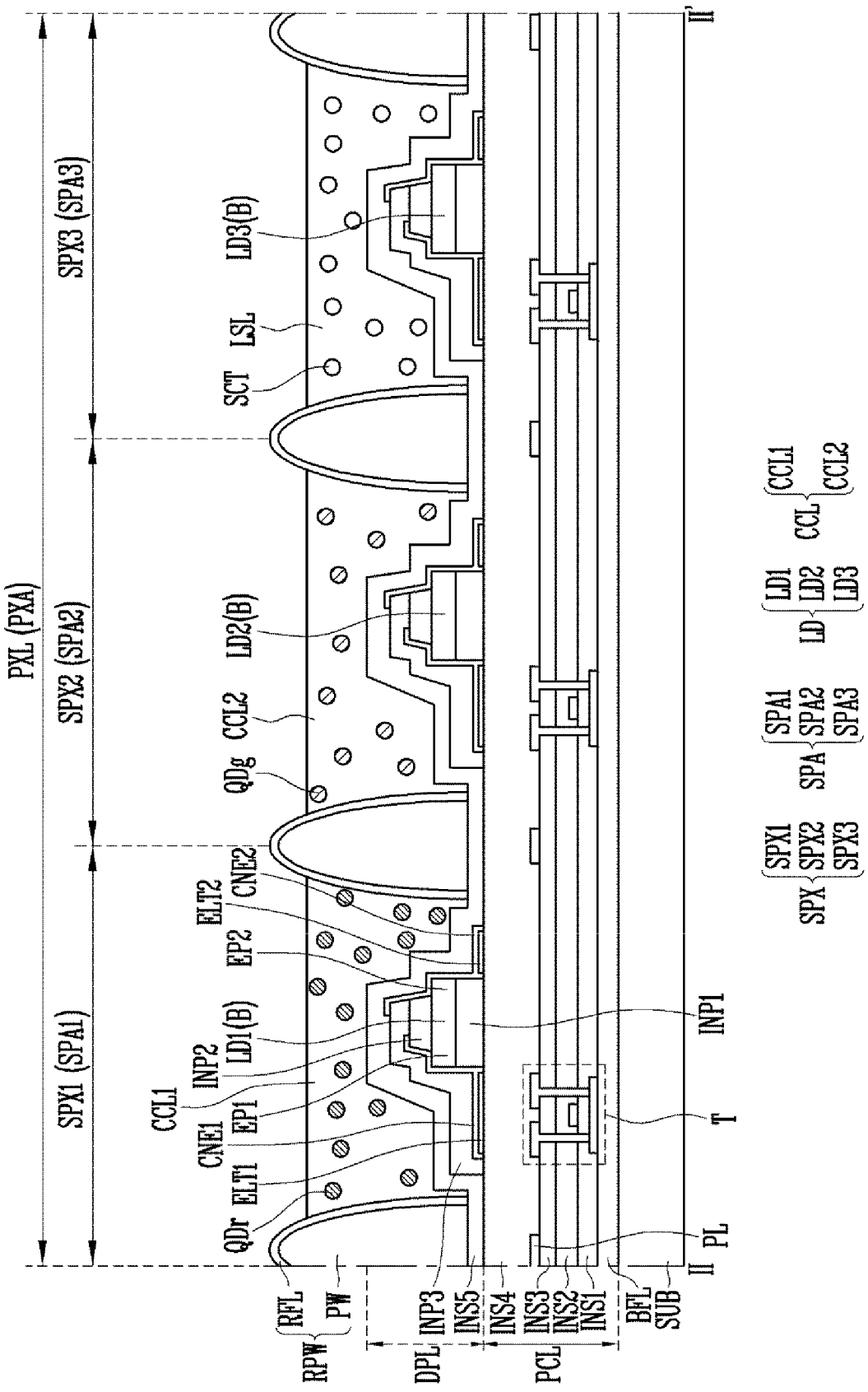

Referring to FIG. 17D, the first and second color conversion layers CCL1 and CCL2 may be formed on the one surface of the substrate SUB on which the display element layer DPL and the partition wall PW have been formed. For example, the first and second color conversion layers CCL1 and CCL2 may be respectively formed in the first and second sub-pixel areas SPA1 and SPA2 on the display element layer DPL.

In an embodiment, the light scattering layer LSL may be further formed on the one surface of the substrate SUB. For example, the light scattering layer SLS may be formed in the third sub-pixel area SPA3 on the display element layer DPL.

In an embodiment, the first and second color conversion layers CCL1 and CCL2 and the light scattering layer LSL may be sequentially formed. For example, an operation of forming each first color conversion layer CCL1 in the corresponding first sub-pixel area SPA1, an operation of forming each second color conversion layer CCL2 in the corresponding second sub-pixel area SPA2, and an operation of forming each light scattering layer LSL in the corresponding third sub-pixel area SPA3 may be sequentially performed. Here, the sequence of performing the operation of forming the first color conversion layer CCL1, the operation of forming the second color conversion layer CCL2, and the operation of forming the light scattering layer LSL is not particularly limited, and it may be changed in various suitable ways.

In an embodiment, some of the first and second color conversion layers CCL1 and CCL2 and the light scattering layer LSL may be concurrently (e.g., simultaneously) formed through the same process. For example, the first and second color conversion layers CCL1 and CCL2 may be formed into an integrated color conversion layer CCL' including a combination of red and green quantum dots QDr and QDg, and may be concurrently (e.g., simultaneously) formed in the first and second sub-pixel areas SPA1 and SPA2.

In an embodiment, the operation of forming the first and second color conversion layers CCL1 and CCL2 (or the integrated color conversion layer CCL') may include an operation of applying, by an inkjet printing method, a fluidic material including quantum dots of at least one color to the first and second sub-pixel areas SPA1 and SPA2 defined inside the partition wall PW. For example, a matrix material including light conversion particles may be supplied into the first and second sub-pixel areas SPA1 and SPA2 by the inkjet printing method or the like using the partition wall PW in a manner similar to a dam structure, and a subsequent process such as a hardening process, may be performed to form the first and second color conversion layers CCL1 and CCL2. Similarly, in the operation of forming the light scattering layer LSL, the light scattering layer LSL may be formed by an inkjet printing method using the partition wall PW.

Referring to FIG. 17E, the capping layer CPL may be selectively formed on the one surface of the substrate SUB on which the first and second color conversion layers CCL1 and CCL2 and/or the light scattering layer LSL has been formed. Furthermore, the first and second color filters CF1 and CF2 may be formed on the one surface of the substrate SUB. For example, the first and second color filters CF1 and CF2 may be respectively formed on the first and second color conversion layers CCL1 and CCL2.

In an embodiment, the third capping layer CPL3 and/or the third color filter CF3 may be further formed on the one surface of the substrate SUB. For example, the third capping layer CPL3 and/or the third color filter CF3 may be formed on the fifth insulating layer INS5 and/or the light scattering layer LSL in the third sub-pixel area SPA3.

Furthermore, in an embodiment, a protective layer, etc., may be further formed on the light conversion pattern layer LCPL.

Various embodiments of the present disclosure may provide a light emitting display device capable of enhancing optical efficiency and expressing vivid colors, and a method of fabricating the light emitting display. Furthermore, in various embodiments, a process of fabricating the light emitting display device may be facilitated, and the production cost may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims and their equivalents.

What is claimed is:

1. A light emitting display device comprising:
a display element layer comprising a plurality of light emitting elements;
a first sub-pixel comprising a first light emitting element from among the plurality of light emitting elements in a first sub-pixel area of the display element layer;
a second sub-pixel comprising a second light emitting element from among the plurality of light emitting elements in a second sub-pixel area of the display element layer;
a third sub-pixel comprising a third light emitting element from among the plurality of light emitting elements in a third sub-pixel area of the display element layer;
a partition wall between the first, the second, and the third sub-pixels and over an insulating layer entirely covering the first, the second, and the third light emitting elements;
a first color conversion layer over the insulating layer in the first sub-pixel area and surrounded by the partition wall; and
a first color filter over the first color conversion layer,
wherein a first region of the insulating layer overlapping the first light emitting element is higher than a second region of the insulating layer that is between the first light emitting element and the partition wall, and a portion of the first color conversion layer overlapping the second region extends lower than the first region, and wherein the second region of the insulating layer comprises a plurality of steps.

2. The light emitting display device according to claim 1, wherein the first, the second, and the third light emitting elements are configured to emit light of a substantially same color.

3. The light emitting display device according to claim 2, wherein the first, the second, and the third light emitting elements are configured to emit blue light.

4. The light emitting display device according to claim 3, wherein the first color conversion layer comprises red quantum dots, and
wherein the first color filter comprises a red color filter.

5. The light emitting display device according to claim 1, further comprising:
a second color conversion layer over the insulating layer in the second sub-pixel area and surrounded by the partition wall; and
a second color filter over the second color conversion layer.

6. The light emitting display device according to claim 5, wherein the first, the second, and the third light emitting elements are configured to emit blue light,
wherein the first color conversion layer comprises red quantum dots and the second color conversion layer comprises green quantum dots, and
wherein the first color filter comprises a red color filter and the second color filter comprises a green color filter.

7. The light emitting display device according to claim 5, wherein the first, the second, and the third light emitting elements are configured to emit blue light,
wherein each of the first and the second color conversion layers comprises a combination of red quantum dots and green quantum dots, and
wherein the first color filter comprises a red color filter and the second color filter comprises a green color filter.

8. The light emitting display device according to claim 5, further comprising:
a light scattering layer over the insulating layer in the third sub-pixel area and surrounded by the partition wall; and
a third color filter over the light scattering layer.

9. The light emitting display device according to claim 8, further comprising:
a first capping layer between the first color conversion layer and the first color filter;
a second capping layer between the second color conversion layer and the second color filter; and
a third capping layer between the light scattering layer and the third color filter.

10. The light emitting display device according to claim 1, further comprising at least one of a light scattering layer and a third color filter over the insulating layer in the third sub-pixel area.

11. The light emitting display device according to claim 1, further comprising a reflective layer on a surface of the partition wall.

12. The light emitting display device according to claim 11, wherein the reflective layer covers an entirety of the surface of the partition wall that is exposed upward from the display element layer.

13. The light emitting display device according to claim 1, wherein the partition wall has a trapezoidal, semi-circular, or semi-elliptical cross-section, a width of which is reduced in a direction away from the display element layer.

14. The light emitting display device according to claim 1, wherein a height of the partition wall is greater than or equal to a height of the first color conversion layer.

15. The light emitting display device according to claim 1, further comprising a substrate having one surface on which the display element layer and the partition wall are successively arranged.

16. The light emitting display device according to claim 15, further comprising a pixel circuit layer between the substrate and the display element layer.

17. The light emitting display device according to claim 1, wherein each of the first, the second, and the third light emitting elements comprises a rod-type light emitting diode having a micro-scale or nano-scale size.

18. A method of fabricating a light emitting display device, the method comprising:
preparing a substrate comprising a first sub-pixel area, a second sub-pixel area, and a third sub-pixel area;
forming a display element layer by respectively forming a first light emitting element, a second light emitting element, and a third light emitting element in the first, the second, and the third sub-pixel areas, and by forming an insulating layer entirely covering the first, the second, and the third light emitting elements;

forming a partition wall between the first, the second, and the third sub-pixel areas over the insulating layer;

respectively forming a first color conversion layer and a second color conversion layer in the first and the second sub-pixel areas over the display element layer, the first color conversion layer being surrounded by the partition wall; and respectively forming a first color filter and a second color filter over the first and the second color conversion layers, wherein a first region of the insulating layer overlapping the first light emitting element is higher than a second region of the insulating layer that is between the first light emitting element and the partition wall, and a portion of the first color conversion layer overlapping the second region extends lower than the first region, and wherein the second region of the insulating layer comprises a plurality of steps.

19. The method according to claim 18, wherein the forming of the first and the second color conversion layers comprises applying, by an inkjet printing method, fluidic material comprising quantum dots of at least one color to the first and second sub-pixel areas defined by the partition wall.

20. The method according to claim 18, further comprising forming at least one of a light scattering layer and a third color filter in the third sub-pixel area over the display element layer.

* * * * *